US008933520B1

(12) United States Patent
Jergovic et al.

(10) Patent No.: US 8,933,520 B1
(45) Date of Patent: Jan. 13, 2015

(54) CONDUCTIVE ROUTINGS IN INTEGRATED CIRCUITS USING UNDER BUMP METALLIZATION

(71) Applicant: Volterra Semiconductor Corporation, Fremont, CA (US)

(72) Inventors: Ilija Jergovic, Palo Alto, CA (US); Efren M. Lacap, Fremont, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 0 days.

(21) Appl. No.: 14/194,414

(22) Filed: Feb. 28, 2014

Related U.S. Application Data

(63) Continuation of application No. 13/454,968, filed on Apr. 24, 2012, now Pat. No. 8,664,767, which is a continuation of application No. 12/343,261, filed on Dec. 23, 2008, now Pat. No. 8,169,081.

(60) Provisional application No. 61/017,139, filed on Dec. 27, 2007.

(51) Int. Cl.
*H01L 23/48* (2006.01)
*H01L 23/522* (2006.01)
(Continued)

(52) U.S. Cl.
CPC ............. *H01L 23/5226* (2013.01); *H01L 24/13* (2013.01); *H01L 23/4824* (2013.01); *H01L 23/53238* (2013.01); *H01L 2924/00014* (2013.01)
USPC .... 257/401; 257/774; 257/369; 257/E23.011; 438/627; 438/629

(58) Field of Classification Search
CPC ... H01L 23/4824; H01L 23/522; H01L 24/05; H01L 24/13; H01L 2224/05624; H01L 2224/05647; H01L 2924/00014; H01L 2224/131
USPC ............ 257/401, 369, 758, E23.01, E23.011, 257/E23.021; 438/627, 629
See application file for complete search history.

(56) References Cited

U.S. PATENT DOCUMENTS 3,689,991 A 9/1972 Aird
3,739,236 A 6/1973 Loro
(Continued)

FOREIGN PATENT DOCUMENTS

EP 0357064 3/1993
EP 0547916 6/1993
(Continued)

OTHER PUBLICATIONS

U.S. Appl. No. 90/009,402, Feb. 12, 2009, Stratakos et al.
(Continued)

*Primary Examiner* — Thinh T Nguyen
(74) *Attorney, Agent, or Firm* — Lathrop & Gage LLP

(57) ABSTRACT

An integrated circuit structure includes a first conductive layer and an under bump metallization layer over the first conductive layer. The first conductive layer has a first conductive region and a second conductive region electrically isolated from the first conductive region. The under bump metallization layer has a first conductive area and a second conductive area electrically isolated from the first conductive area, the first conductive area substantially located over the first conductive region and the second conductive area substantially located over the second conductive region. At least one of the first conductive area or the first conductive region includes a first protrusion extending toward the second conductive area or second conductive region, respectively. Conductive vias connect the first conductive region to the second conductive area and connect the second conductive region to the first conductive area, and the vias include at least one via connected to the first protrusion.

16 Claims, 7 Drawing Sheets

(51) Int. Cl.
*H01L 23/482* (2006.01)
*H01L 23/00* (2006.01)
*H01L 23/532* (2006.01)

(56) References Cited

U.S. PATENT DOCUMENTS

| | | | |
|---|---|---|---|
| 3,922,712 A | 11/1975 | Stryker |
| 4,000,842 A | 1/1977 | Burns |
| 4,074,342 A | 2/1978 | Honn et al. |
| 4,095,165 A | 6/1978 | Boros |
| 4,109,194 A | 8/1978 | Miller |
| 4,188,438 A | 2/1980 | Burns |
| 4,233,558 A | 11/1980 | Gaetmer |
| 4,255,672 A | 3/1981 | Ohno et al. |
| 4,292,581 A | 9/1981 | Tan |
| 4,309,650 A | 1/1982 | Boros et al. |
| 4,315,316 A | 2/1982 | Boros et al. |
| 4,353,114 A | 10/1982 | Saleh |
| 4,356,542 A | 10/1982 | Bruckner et al. |
| 4,357,572 A | 11/1982 | Andersen et al. |
| 4,462,041 A | 7/1984 | Glenn |
| 4,520,298 A | 5/1985 | Abbondanti |
| 4,612,617 A | 9/1986 | Laplace, Jr. et al. |
| 4,630,187 A | 12/1986 | Henze |
| 4,636,825 A | 1/1987 | Baynes |
| 4,695,865 A | 9/1987 | Wagenaar |
| 4,725,940 A | 2/1988 | Henze |
| 4,761,725 A | 8/1988 | Henze |
| 4,805,079 A | 2/1989 | Van Buul |
| 4,821,084 A | 4/1989 | Kinugasa et al. |
| 4,833,513 A | 5/1989 | Sasaki |
| 4,855,888 A | 8/1989 | Henze et al. |
| 4,890,142 A | 12/1989 | Tonnel et al. |
| 4,918,026 A | 4/1990 | Kosiak et al. |
| 4,929,884 A | 5/1990 | Bird et al. |
| 4,947,101 A | 8/1990 | McVey |
| 4,948,645 A | 8/1990 | Holzinger et al. |
| 4,948,754 A | 8/1990 | Kondo et al. |
| 5,003,244 A | 3/1991 | Davis, Jr. |
| 5,029,282 A | 7/1991 | Ito |
| 5,046,657 A | 9/1991 | Iyer et al. |
| 5,047,358 A | 9/1991 | Kosiak et al. |
| 5,111,278 A | 5/1992 | Eichelberger |
| 5,143,865 A | 9/1992 | Hideshima et al. |
| 5,146,300 A | 9/1992 | Hamamoto et al. |
| 5,239,196 A | 8/1993 | Ikeda et al. |
| 5,268,871 A | 12/1993 | Dhong et al. |
| 5,272,614 A | 12/1993 | Brunk et al. |
| 5,283,452 A | 2/1994 | Shih et al. |
| 5,299,091 A | 3/1994 | Hoshi et al. |
| 5,305,192 A | 4/1994 | Bonte et al. |
| 5,309,324 A | 5/1994 | Herandez et al. |
| 5,352,942 A | 10/1994 | Tanaka et al. |
| 5,391,904 A | 2/1995 | Asami et al. |
| 5,399,898 A | 3/1995 | Rostoker |
| 5,410,467 A | 4/1995 | Smith et al. |
| 5,412,239 A | 5/1995 | Williams |
| 5,422,562 A | 6/1995 | Mammano et al. |
| 5,438,499 A | 8/1995 | Bonte et al. |
| 5,439,162 A | 8/1995 | George et al. |
| 5,453,953 A | 9/1995 | Dhong et al. |
| 5,468,984 A | 11/1995 | Efland et al. |
| 5,475,296 A | 12/1995 | Vinsant et al. |
| 5,479,089 A | 12/1995 | Lee |
| 5,481,178 A | 1/1996 | Wilcox et al. |
| 5,503,286 A | 4/1996 | Nye, III et al. |
| 5,514,947 A | 5/1996 | Berg |
| 5,521,426 A | 5/1996 | Russell |
| 5,528,480 A | 6/1996 | Kikinis et al. |
| 5,546,297 A | 8/1996 | Duley |
| 5,552,694 A | 9/1996 | Appeltans |
| 5,578,916 A | 11/1996 | Muterspaugh |
| 5,594,631 A | 1/1997 | Katoozi et al. |
| 5,600,257 A | 2/1997 | Leas et al. |
| 5,610,452 A | 3/1997 | Shimer et al. |
| 5,610,503 A | 3/1997 | Fogg et al. |
| 5,612,553 A | 3/1997 | Arakawa |
| 5,614,762 A | 3/1997 | Kanamori et al. |
| 5,615,477 A | 4/1997 | Sweitzer |
| 5,646,513 A | 7/1997 | Riggio, Jr. |
| 5,659,950 A | 8/1997 | Adams et al. |
| 5,665,991 A | 9/1997 | Efland et al. |
| 5,671,121 A | 9/1997 | McMahon |
| 5,672,894 A | 9/1997 | Maeda et al. |
| 5,675,240 A | 10/1997 | Fujisawa et al. |
| 5,677,618 A | 10/1997 | Fiez et al. |
| 5,677,619 A | 10/1997 | Doluca |
| 5,684,305 A | 11/1997 | Pearce |
| 5,684,328 A | 11/1997 | Jin et al. |
| 5,723,974 A | 3/1998 | Gray |
| 5,728,594 A | 3/1998 | Efland et al. |
| 5,731,223 A | 3/1998 | Padmanabhan |
| 5,736,766 A | 4/1998 | Efland et al. |
| 5,744,843 A | 4/1998 | Efland et al. |
| 5,751,140 A | 5/1998 | Canter |
| 5,757,168 A | 5/1998 | DeVale |
| 5,773,888 A | 6/1998 | Hosomi et al. |
| 5,777,362 A | 7/1998 | Pearce |
| 5,777,383 A | 7/1998 | Stager et al. |
| 5,793,126 A | 8/1998 | Gray |
| 5,801,091 A | 9/1998 | Efland et al. |
| 5,814,844 A | 9/1998 | Nagata et al. |
| 5,818,090 A | 10/1998 | Kimura |
| 5,834,849 A | 11/1998 | Lane |
| 5,847,951 A | 12/1998 | Brown et al. |
| 5,859,456 A | 1/1999 | Efland et al. |
| 5,859,474 A | 1/1999 | Dordi |
| 5,903,058 A | 5/1999 | Akram |
| 5,914,873 A | 6/1999 | Blish, II |
| 5,945,730 A | 8/1999 | Sicard et al. |
| 5,945,872 A | 8/1999 | Robertson et al. |
| 5,950,072 A | 9/1999 | Queyssac |
| 5,951,804 A | 9/1999 | Kweon et al. |
| 5,952,726 A | 9/1999 | Liang |
| 5,953,214 A | 9/1999 | Dranchak et al. |
| 5,959,442 A | 9/1999 | Hallberg et al. |
| 5,959,443 A | 9/1999 | Littlefield |
| 5,969,513 A | 10/1999 | Clark |
| 5,969,514 A | 10/1999 | Merrill |
| 5,973,367 A | 10/1999 | Williams |
| 6,020,613 A | 2/2000 | Udomoto et al. |
| 6,020,729 A | 2/2000 | Stratakos et al. |
| 6,025,618 A | 2/2000 | Chen |
| 6,028,417 A | 2/2000 | Ang et al. |
| 6,031,361 A | 2/2000 | Burstein et al. |
| 6,037,677 A | 3/2000 | Gottschall et al. |
| 6,041,013 A | 3/2000 | Kohno |
| 6,075,710 A | 6/2000 | Lau |
| 6,084,266 A | 7/2000 | Jan |
| 6,100,591 A | 8/2000 | Ishii |
| 6,100,676 A | 8/2000 | Burstein et al. |
| 6,133,634 A | 10/2000 | Joshi |
| 6,150,722 A | 11/2000 | Efland et al. |
| 6,150,724 A | 11/2000 | Wenzel et al. |
| 6,159,841 A | 12/2000 | Williams et al. |
| 6,160,441 A | 12/2000 | Stratakos et al. |
| 6,180,265 B1 | 1/2001 | Erikson |
| 6,184,555 B1 | 2/2001 | Tihanyi et al. |
| 6,198,261 B1 | 3/2001 | Schultz et al. |
| 6,225,795 B1 | 5/2001 | Stratakos et al. |
| 6,268,716 B1 | 7/2001 | Burstein et al. |
| 6,271,060 B1 | 8/2001 | Zandman et al. |
| 6,278,264 B1 | 8/2001 | Burstein et al. |
| 6,287,893 B1 | 9/2001 | Elenius et al. |
| 6,331,455 B1 | 12/2001 | Rodov et al. |
| 6,400,126 B1 | 6/2002 | Zuniga et al. |
| 6,429,630 B2 | 8/2002 | Pohlman et al. |
| 6,441,487 B2 | 8/2002 | Elenius et al. |
| 6,462,522 B2 | 10/2002 | Burstein et al. |
| 6,476,486 B1 | 11/2002 | Humphrey et al. |
| 6,477,079 B2 | 11/2002 | Kaneko et al. |
| 6,489,678 B1 | 12/2002 | Joshi |
| 6,492,738 B2 | 12/2002 | Akram et al. |
| 6,501,166 B2 | 12/2002 | Wood et al. |

(56) References Cited

U.S. PATENT DOCUMENTS

| | | | |
|---|---|---|---|
| 6,512,253 | B2 | 1/2003 | Watanabe et al. |
| 6,525,516 | B2 | 2/2003 | Schultz et al. |
| 6,559,684 | B2 | 5/2003 | Goodfellow et al. |
| 6,580,258 | B2 | 6/2003 | Wilcox et al. |
| 6,590,369 | B2 | 7/2003 | Burstein et al. |
| 6,630,737 | B2 | 10/2003 | Zhao et al. |
| 6,693,361 | B1 | 2/2004 | Siniaguine et al. |
| 6,700,209 | B1 | 3/2004 | Raiser et al. |
| 6,710,441 | B2 | 3/2004 | Eden et al. |
| 6,713,823 | B1* | 3/2004 | Nickel ............... 257/401 |
| 6,737,301 | B2 | 5/2004 | Eden et al. |
| 6,821,813 | B2 | 11/2004 | Su |
| 6,831,331 | B2 | 12/2004 | Kitamura et al. |
| 6,965,502 | B2 | 11/2005 | Duffy et al. |
| 6,984,792 | B2 | 1/2006 | Brofman et al. |
| 6,992,384 | B2 | 1/2006 | Joshi |
| 7,002,249 | B2 | 2/2006 | Duffy et al. |
| 7,023,672 | B2 | 4/2006 | Goodfellow et al. |
| 7,262,583 | B2 | 8/2007 | Pohlman et al. |
| 7,301,235 | B2 | 11/2007 | Schaffer et al. |
| 8,664,767 | B2 | 3/2014 | Jergovic et al. |
| 2001/0015497 | A1 | 8/2001 | Zhao et al. |
| 2001/0038277 | A1 | 11/2001 | Burstein et al. |
| 2002/0017697 | A1 | 2/2002 | Kitamura et al. |
| 2002/0104872 | A1 | 8/2002 | DeFelice et al. |
| 2004/0130303 | A1 | 7/2004 | Pohlman et al. |
| 2008/0111242 | A1* | 5/2008 | Lin et al. ............... 257/758 |
| 2008/0185736 | A1 | 8/2008 | Lin |
| 2008/0197172 | A1 | 8/2008 | Reiber |

FOREIGN PATENT DOCUMENTS

| | | |
|---|---|---|
| WO | 85/04518 | 10/1985 |
| WO | 95/31033 | 11/1995 |
| WO | 99/31790 | 6/1999 |
| WO | 01/57608 | 8/2001 |

OTHER PUBLICATIONS

U.S. Appl. No. 90/009,403, Feb. 12, 2009, Stratakos et al.
U.S. Appl. No. 90/009,435, Apr. 6, 2009, Burstein et al.
U.S. Appl. No. 90/009,437, Apr. 30, 2009, Burstein et al.
Acker, Brian et al., "Synchronous Rectification with Adaptive Timing Control," Dept. of Electrical Engineering and Comp. Sciences, University of California, Berkeley 1995. IEEE ISBN 0 7803 2730 6. pp. 88-95.
Allen, J.J. et al. (1998) "Integrated Micro-Electro-Mechanical Sensor Development for Inertial Applications," 1998 IEEE, 0-7803-4330-1/98, 8 pgs [1021-1028].
Arbetter, Barry et al. (1998) "Control Method for low-Voltage DC Power Supply in Battery-Powered Systems with Power Management," IEEE Power Electronics Specialists Conference, St. Louis, MS, Jun. 22, 1997, 6 pgs [859-864].
Arbetter, Barry et al. (1997) "DC-DC Converter with Fast Transient Response and high Efficiency for Low-Voltage Microproessor Loads," IEEE Power Electronics Specialists Conference, St. Louis, MS, Jun. 22-27, 1997, 8 pgs [865-872].
Arzumanyan, Aram, et al., "Flip Chip Power MOSFET: A New Wafer Scale Packaging Technique," As presented at ISPSD, Jun. 2001, International Rectified Corporation. 4 pgs.
Asada, G. et al. (1997) "Low Power Wireless Communication and Signal Processing circuits for Distributed Microsensors," 1997 IEEE Intnl Symposium on Circuits and Systems, Jun. 9-12, 1997, Hong Kong, 2817-2820, 4pgs [940-943].
Atencio, S. et al. (1999) "Design, Analysis, and Fabrication of the APT Cavitites," Proceedings of the 1999 Particle Accelerator Conference, New York, 965-967, 3 pgs [1018-1020].
Bai, John G. et al. (2003) "Flip-Chip on Flex Integrated Power Electronics Modules for High-Density Power Integration," IEEE Transactions on Advanced Packaging, vol. 26, No. 1, Feb. 2003, 6 pgs [54-59].

Baker, R. Jacob et al. CMOS Circuit Design, Layout and Simulation, IEEE Press, 1998, ISBN 0-7803-3416-7. (468 pages).
Baker, R. Jacob et al., CMOS Circuit Design, Layout and Simulation, Second Edition, IEEE Press, 2005, ISBN 978-81-265-203-4. (541 pages).
Balthasar, Peter P. and Reimers, Eberhart. "The Integrated Power Switch," IEEE Transactions on Industry Applications, vol. 1A-12, No. 2, Mar./Apr. 1976, pp. 179-191.
Bandyopadhyay, A. et al. (1998) "A Simplified Approach to Time-Domain Modeling of Avalanche Photodiodes," IEEE Journal of Quantum Electronics, vol. 34, No. 4, Apr. 1998, 691-699, 9 pgs [989-997].
Bentz, Ole et al. (1995) "Information Based Design Environment," 1995 IEEE No. 0-7803-2312-1/95, 10 pgs [1627-1636].
Bentz, Ole et al. (1997) "A Dynamic Design Estimation and Exploration Environment," ACM, Inc., DAC 97, Anaheim, CA, ACM 0-89791-920-3/07/06, pp. 190-195, Jun. 9-13, 1997, 6 pgs [1607-1612].
Bentz, Ole et al. "A Dynamic Design Estimation and Exploration Environment", Department of Electrical Engineering and Computer Science, University of California, Berkeley, Proceedings of the 34th Design Automation Conference, 1997. IEEE 1997, pp. 190-195.
Bentz, Ole et al. "Information Based Design Environment", University of California, Berkeley, Workshop on VLSI Signal Processing. VIII, 1995. IEEE Signal Processing Society, Oct. 16-18, 1995, pp. 237-246 IEEE 1995, pp. 237-246.
Bessemoulin, A. et al., "A 1-watt Ku-band Power Amplifier MMIC using Cost-Effective Organic SMD Package", $34^{th}$ European Microwave Conference, Amsterdam, 2004 pp. 349-352.
Biswas, Sujit K. el al., "IGBT-Bipolar Discrete Darlington Power Switches: Performance and Design", Industry Applications Society Annual Meeting, 1991., Conference Record of the 1991 IEEE, Sep. 28-Oct. 4, 1991, vol. 2. pp. 1483-1489.
Boustedt, Katarina (1998) "GHz Flip Chip. An Overview," 1998 IEEE, No. 0-7803-4526-6/98, 6 pgs.
Brandenburg, S. and Yeh, S. {1998) "Electromigration Studies of Flip Chip Bump Solder Joints," Delphi Delco Electronics Systems, Kokomo, Indiana. In Proceedings Surface Mount International 1998 San Jose, Calif. Aug. 23, 1998. 8 pgs.
Brodersen, R. et al. (1994) "Research Challenges in Wireless Multimedia," PIMRC, 1994 P1.I, 1-5, 5 pgs [948-952].
Brown, Jess et al. "Novel Trench Gate Structure Developments Set the Benchmark for Next Generation Power MOSFET Switching Performance", PCIM Europe 2003 International Conference and Exhibition, May 22-22, 2003, Nuremberg, Germany (4 pages).
Brown, William D. "Advanced Electronic Packaging With Emphasis on Multichip Modules," IEEE Press Series on Microelectronic Systems, Stuart K. Tewksbury, Series Editor, IEEE Computer Society Press, Oct. 13, 1998, the Institute of Electrical and electronics Engineers, Inc. New York, pp. 415.
BSAC IP Practices Statement, www.bsac.eecs.berkeley.edu/about/ip.html?PHPSESSID=22. (2 pages).
Bult, K. et al. (1996) "Low Power Systems for Wireless Microsensors," ISLPED 1996 Monterey. CA, 1996, 17-21, 5 pgs. [935-939].
Burd, Thomas D. et al. (2000) "A Dynamic voltage Scaled Microprocessor System," IEEE Journal of Solid-State Circuits, vol. 35, No. 11, Nov. 2000, 10 pgs [1712-1781].
Burd, Thomas D. et al ., "A Dynamic Voltage Scaled Microprocessor System," SolidState Circuits Conference, Feb. 7-9, 2000. Paper 17.4. ISSCC. 2000 IEEE International. 20 pp.
Burdio, Jose ct al. (1995) "A Unified Discrete-Time State-Space Model for Switching ConvertErs," IEEE Transactions on Power Electronics, vol. 10, No. 6, Nov. 1995, 14 pgs. [873-886].
Burstein, Amit et al. (1995) "Mixed Analog-Digital highly-Sensitive Sensor Interface Circuit for Low-Cost Microsensors," Ithe 8th Intnl Conf on Solid•State Sensors and Actuators and Eurosensors, Stockholm, Sweden, Jun. 25-29, 1995, 162-165, 4 pgs [944-947].
Burstein, Andrew et al. (1995) "The InfoPad user Interface," IEEE 1995, 1063-6390/159-162,4 pgs. [967-970].
Casaravilla, Gonzalo and Silveira, Fernando. "Emitter Drive: A Technique to Drive a Bipolar Power Transistor Switching at 100kHz", Colloquium in South America, 1990, Proceedings of the 1990 IEEE, pp. 188-192.

(56) References Cited

OTHER PUBLICATIONS

Chandrakasan, Anantha et al. (1994) "A Low Power Chipset for a Portable Multimedia I/O Termianl," *IEEE Journal of Solid-State Circuits*, vol. 29, No. 12, Dec. 1994,1415-1428 12 pgs. [892-905].

Chandrakasan, Anantha et a l. (1994) A Low Power chipset for Portable Multimedia Applications, 1994 IEEE International Solid-State Circuits Conference, ISSCC94, Session 5, Technology Directions: Low-Power Technology, Paper WP5.I, Feb. 16, 1994, 2 pgs. [887-888].

Chandrakasan, Anantha et al. (1994) "Design of Portable Systems," IEEE 1994 Custom Integrated circuits Conference, No. 0-7803-1886-2/94, 8 pgs [1792-1799].

Chen, Sue and Geza, Joos. "Series and Shunt Active Power Conditioners for Compensating Distribution System Faults," IEEE Canadian Conference on Electrical and Computer Engineering, Conference Proceedings vol. 2, May 7-10, 2000, pp. 1182-1186.

Chetty, P.R.K. (1986) "Switch-Mode Power Supply Design," TAB Professional and Reference Books, Division of TAB Books, Inc., 1986, 5pgs [971-975].

Chow, T. Paul and Baliga, B. Jayant. NA New Hybrid VDMOS-LIGBT Transistor, IEEE Electron Device Letters, vol. 9, No. 9. Sep. 1988, pp. 473-475.

Cooley, G. M. and Fiez, Terri (1995) "PWM and PCM Techniques for Control of Digitally Programmable Switching Power Supplies," 1995 IEEE, 0-7803-2570•2/95, 1114-1117, 4 pgs [1044-1047].

Clark, W.A. and Pelosi, W. (1990) "Area Distributed Soldering of Flexible and Rigid Printed Circuit Boards," 1990 IEEE, 0148-6411/901200-0698, 6 pgs [1003-1008].

Clech, Jean-Paul and Fjelstad, Joseph. "Reliability Prediction Modeling of an Area Array CSPs", Electronic Packaging Solutions International, Inc. Jun. 1997 pp. 91-96.

Dancy, Abram and Chandrakasan, Anantha (1997) "Ultra Low Power Control Circuits for PWM Converters," 1997 IEEE, 0-7803-3840-5/97, 21-27, Jun. 22-27, 1997, 7 pgs [1152-1158].

Dancy, Abram P. (1996) "Power Supplies for Ultra Low Power Applications," Archives of the Massachusetts Institute of Technology, Oct. 29, 1997, 104 pgs [1048-1151].

Darwish, M. et al. (1998) "Scaling Issues in Lateral power MOSFETs," Proc 0/1998 Intrnl Symposium on Power Semiconductor Devices and ICs. Kyoto, 11.33/329-332, 4 Pgs. [1159-1162].

Deering, Scott E. and Szekely, Julian. "Mathematical Modeling of Alternative Pad Designs in Flip-Chip Soldering Processes," Journal of Electronic Materials, vol. 23, No. 12, Dec. 1994, pp. 1325-1334.

Defendant's Patent L.R. 3-3 Invalidity Contentions and Patent L.R. 3-4: Volterra v. Primarion, Inc., No. C 08-05129 JCS, (D. Cal., N.D. S.F. Jul. 6, 2009). Exhibits A-G attached. 716 pgs.

Dixon, Lloyd, "Average Current Mode Control of Switching Power Supplies," Unitrode Switching Regulated Power Supply Design Seminar Manual, Unitrode Corporation, C1-1 to C1-14. 1991 (16 pages).

Dixon, Lloyd, "Switching Power Supply Topology Review," Unitrode Switching Regulated Power Supply Design Seminar Manual, Unitrode Corporation, P1-1 to P1-12, 1991. (14 pages).

Dravet, Alain, et al. "Flip Chip and Tab Interconnects for Millimeter Wave MMICs: A Comprehensive Study", GAAS 98, Amsterdam, 1998, pp. 656-661.

Dunn, William C. "Driving and Protection of High Side NMOS Power Switches," IEEE Transactions on Industry Applications, vol. 28, No. 1, Jan./Feb. 1992, pp. 26-30.

Elantec (1996) EL7560C Programmable CPU Power Supply Unit, elantec High Performance Analog Integrated Circuits, Inc. (product description brochure) Jul. 1996 Rev. A, 12 pgs. [1202-1213].

Elantec (2000) EL7556AC Programmable CPU Power Supply Unit, elantec High Performance Analog Integrated Circuits, Inc. (product description brochure) Feb. 28, 2000, 13 pgs. [1163-1175].

Elantec (2001) EL7556BC Integrated Adjustable 6 Amp Synchronous Switcher, elantec High Performance Analog Integrated Circuits, Inc. (product description brochure), Oct. 5, 2001, 13 pgs [1176-1188].

Elantec EL 7556C Adjustable CPU Power Supply Unit, elantec High Performance Analog Integrated Circuits, Inc. (product description brochure) 13 pgs [1189-1201].

Elmoznin, Abdellatif et al. "The Smart Power High-Side Switch: Description of a Specific Technology, Its Basic Devices, and Monitoring Circuitries", IEEE Transactions on Electron Devices, vol. 37, No. 4, Apr. 1990 pp. 1154-1161.

Fairchild Semiconductor "FDMF8704: High Efficiency/High Frequency FET Plus Driver Multi-Chip Module", Rev. G, Fairchild Semiconductor Corporation, Nov. 2007 pp. 1-10.

Farley, B. G. and Clark, W.A. "Simulation of Self-Organized Systems by Digital Computer," Lincoln Laboratory at MIT, Cambridge, MA, 1954. Downloaded by licensed user from IEEE Xplore on Dec. 15, 2008, 9 pgs. [1035-1043].

Farley, B.G. et al. (1962) "Computer Techniques for the study of Patterns in the Electroncephalogram." IRE Transactions on Bio-Medical Electronics. Jan. 1962, 9 pgs. [1009-1017].

"FC-09 A 2X2 mm MOSFET BGA Tape and Reel Dimensions," Mar. 2000, Rev. A, Fairchild Semiconductor Corporation. 4 pgs.

"FDZ202P: P-Channel 2.5V Specified Power Trench™ BGA MOSFET," Nov. 1999 Advance Information, Fairchild Semiconductor Corporation. 4 pgs.

"FDZ204P: P-Channel 2.5 V Specified Power Trench® BGA MOSFET," Dec. 2000 Preliminary, Fairchild Semiconductor Corporation. 4 pgs.

"FDZ5047N: 30V N-Channel Logic Level Power Trench® BGA MOSFET," Dec. 1999 Advance Information, Fairchild Semiconductor Corporation, 4 pgs.

Feng, Wong Da. "Diode as Pseudo Active Switch in High Frequency Narrowband DC/DC Converter," Power Electronics Specialists Conference, 1991. PESC '91 Record 22nd Annual IEEE, Jun. 24-27, 1991, 182-185.

Fjelstad, J. et al. "Compliancy Modeling of an Area Array Chip Scale Package", Proceedings, Surface Mount International, San Jose, CA Sep. 10-12, 1996 vol. I, pp. 236-243.

Frear, D. R. "Issues Related to the Implementation of Pb-Free Electronic Solders in Consumer Electonics", J. Mater. Sci.: Mater. Electron (2007) 18: pp. 319-330.

Frederiksen, Thomas M. Intuitive IC Electronics, A Sophisticated Primer for Engineers and Technicians, McGraw-Hill Book Company, 1982, ISBN 0-07-021923-0. (104 pages).

Free Online Encyclopedia, "chip on board definition of chip on board", http://encyclopedia2.thefreedictionary.com/chip+on+board, downloaded Mar. 3, 2010 (2 pages).

Furukawa, T. et al. (1997) Accelerated Gate-Oxide Breakdown I Mixed-Voltage I/O Circuits, 1997 IEEE, 0-7803-3575-9/97, Apr. 8, 1997, 169-173, 5 pgs [998-1002].

F&K Delvotec, "Chip-on-Board Technology", Apr. 4, 2007, http://www.fkdelvotec.at/press.php. (9 pages).

Galiere, J. et al., "Millemetre-wave MMIC packaging compatible with surface-mount technology (SMT)", 12$^{th}$ GAAS Symposium, Amsterdam, 2004, pp. 591-594.

Gamota, Daniel R. and Melton, Cindy M. "Advanced Encapsulant Systems for Flip-Chip-on-Board Assemblies: Underfills with Improved Manufacturing Properties", IEEE Transactions on Components, Packaging, and Manufacturing Technology, Part C., vol. 21, No. 3, Jul. 1998 pp. 196-203.

Giesler, J. et al. "Flip Chip on Board Connection Technology: Process Characterization and Reliability", IEEE Transactions on Components, Packaging and Manufacturing Technology, Part B, vol. 17, No. 3, Aug. 1994, pp. 256-263.

Gilbert, P. et al. (1998) "A high Performance 1.5V, 0.10μm Gate Length CMOS Technology with Scaled copper Metallization," 1998 IEEE, IEDM 98-1013, 4 pgs. [978-981].

Gilg, Larry. "Challenges in Bare Die Mounting," Die Products Consortium, Austin, Texas, www.dieproducts.org/tutorials/assembly/bare_die_mounting.pdf. pp. 1-8.

Gilleo, Ken. "Direct Chip Interconnect Using Polymer Bonding," IEEE Transactions on Components, Hybrids, and Manufacturing Technology, vol. 13, No. I, Mar. 1990, pp. 229-234.

Goldmann, L. S. "Geometric Optimization of Controlled Collapse Interconnections," IBM Journal of Research and Development, vol. 13 No. 3, pp. 251-265.

(56) References Cited

OTHER PUBLICATIONS

Goodman, James et al. (1998) "An Energy/Security Scalable Encryption Processor Using an Embedded Variable Voltage DC/DC Converter," IEEE Jrnl of Solid-State Circuits. vol. 33, No. 11, 1799-1809, Nov. 1998, 11 pgs [1390-1400].

Griffin, Timothy E. ( 1995) "Multichip Modules Including Processing, A Literature Survey," Army Research Laboratory, ARL-MR-257, No. 19950906-048, Aug. 1995, 26 pgs. [1401-1426].

Gupta, Tarun et al. (1997) "Implementation of a Fuzzy Controller for DC-DC Converters Using an Inexpensive 8-b Microcontroller." IEEE Trans on Industrial Electronics, vol. 44, No. 5, Oct. 1997, 9 pgs. [1427-1435].

Gutnik, Vadim and Chandrakasan, Anantha (1997) "Embedded Power Supply for Low-Power DSP," IEEE Trans on Very Large Scale Integration (VLSI) Systems, vol. 5, No. 4, Dec. 1997, 11 pgs. [1436-1446].

Habekotte, Ernst et al. "A Coplanar CMOS Power Switch", IEEE Journal of Solid-State Circuits, vol. SC-16,No. 3, Jun. 1981, pp. 212-226.

Haralson, Il et al. (1997) "Numerical Simulation of Avalanche Breakdown with In-P-InGaAs SAGCM Standoff Avalanche Photodiodes," Journal of Lightwave Technology, vol. 15, No. 11, Nov. 1997, 4 pgs. [1029-1032].

Harper, C. A. , editor, Electronic Packaging and Interconnection Handbook, McGraw-Hill, 1991 pp. 6.64-6.71.

Hawkins, William G. "Power ICs Move Ink let Printers to New Performance Levels", Electron Devices Meeting, 1995, International, Dec. 10-13, 1995, pp. 959-962.

HIP5020 Integrated-Power Buck Convereter Controller with Synchronous Rectification, HARRIS Semiconductor (product description brochure) File No. 4253, Jan. 1997 (19-0146: Rev. 2: 5/94), 16 pgs [1214-1229].

Hnatek, Eugene R., Integrated Circuit Quality and Reliability, Second Edition, Marcel Dekker, 1995, pp. 99-175, 293-307.

Hobrecht, Stephen. "An Intelligent BiCMOS/DMOS Quad 1-A High-Side Switch," IEEE Journal of Sold-State Circuits, vol. 25, No. 6, Dec. 1990, pp. 1395-1402.

Hood, Robert B. "Proposed Integrated Circuit for Appliance or Process Control," IEEE Transactions on Industry and General Applications, vol. IGA-4, No. 5, Sep. 1968, pp. 520-526.

Horowitz, Paul and Hill, Winfried. The Art of Electronics: Second Edition, Cambridge University Press, 2006, pp. 321-322: Chapter 6 Voltage Regulators and Power Circuits, Section 8; pp. 341-345; Chapter 6, Section 16 through Section 18; p. 819; Chapter 11 Microprocessor Support Chips, Section 12. (11 pages).

Huang, J.S.T. et al. "VIB-3 Bidirectional Lateral Insulated Gate Transistors Operated in Controlled Latchup Mode", IEEE Transactions on Electron Devices, vol. 35, No. 12, Dec. 1988, p. 2458.

Huliehel, F. and Ben_Yaakov, S. (1989) "Low-Frequency Sampled-Data Models of Switched Mode DC-DC Converters," 1989 IEEE, CH 2721-9/89/0000-0492m 8 pgs. [1447-1454].

Hur, Jung H. et al., "GaAs-Based Opto-Thyristor for Pulsed Power Applications," IEEE Transactions on Electron Devices, vol. 37, No. 12, Dec. 1990, pp. 2520-2525.

IEEE Standard Dictionary of Electrical and Electronics Terms, Second Edition Revised and Expanded, IEEE Std 100-1977, Published by the Institute of Electrical and Electronics Engineers, Inc., 1997 p. 197—dominant mode through dot signal; p. 510—potier reactance through power active; p. 694—sweep-delay accuracy through switchboard lamp (6 pages).

IEEE Standard Dictionary of Electrical and Electronics Terms, ANSI/IEEE std. 100-1988 Fourth Edition, 1988, Published by the Institute of Electrical and Electronics Engineers, Inc., p. 287—dopant through double circuit systems; p. 717—potentiometer, grounded through power; p. 718—power, active through power, active; p. 728—power rectifier transformer through power system emergency; p. 972—sweep, free-running through switchboard cord. (9 pages).

Infineon Technologies, "TDA21201: Integrated Switch (MOSFET Driver and MOSFETs)", Infineon Technologies AG, Preliminary Data Sheet, Apr. 29, 2002, downloaded from www.datasheetcatalog.com (16 pages).

Intel® "DrMOS Specifications", Nov. 2004, Revision 1.0 (17 pages).

Intel® "Mobile Pentium® III Processor At 233 MHz, 266MHz and 300 MHz", Intel Corporation 1998 Order No. 243669-002 (74 pages).

Intel® "Pentium® III Processor for the PGA370 Socket at 500 MHz to 1.13 GHz", Datasheet, Revision 8, Jun. 2001, Document No. 245264-08 (94 pages).

International IOR Rectifier, iPOWIR™ Technology, "PD-60325 iP2005APbF: High Frequency Synchronous Buck Optimized LGA Power Stage: Integrated Power Semiconductors, Driver IC & Passives", www.irf.com, Feb. 8, 2008 (18 pages).

International IOR Rectifier, iPOWIR™ Technology, "PD-94568A iP2002: Synchronous Buck Multiphase Optimized BGA Power Block: Integrated Power Semiconductors, Drivers & Passives", www.irf.com, Mar. 20, 2003 (12 pages).

IPIRA Office of Intellectual Property & Industry Research Alliances University of California, Berkeley, UC Patent Policy, Sep. 4, 1997, www.ucop.edu/ott/genresources/pat-pol_97.html (5 pages).

Jarc, Dennis A. and Novotny, Donald W. "A Graphical Approach to AC Drive Classification", IEEE Transactions on Industry Applications, vol. 1A-23, No. 6, Nov./Dec. 1987, pp. 1029-1035.

Jittinorasett, Suwanna. "UBM Formation on Single Die/Dice for Flip Chip Applications," (Aug. 25 , 1999) (unpublished M.S. dissertation, Virginia Polytechnic Institute and State University), http://scholar.lib.vt.edu.theses/available/etd-082699-110209/unrestricted/Final.pdf. pp. 1-89.

Joshi et al. (2000) "MOSFET BGA Package," *2000 IEEE*, electronic Components and Technology Conference, No. 0-7803-5911-9/00, 4 pgs.

Jung, Erik et al. (1999) "Flip Chip Contats for high Current Conducting Assemblies," 1999 IEEE, 0-7803-5502-4/99, 7 pgs. [1460-1466].

Jung, Sang-Hwa et al. (1999) "An Integrated CMOS DC-DC Converter," 1998 IEEE, 0-7803-5502-4/99, 5 pgs. [1455-1459].

Kassakian et al. "Form and Function: An Overview, Chapter 2; 2.3 DC/DC Converters" Principles of Power Electronics. Addison-Wesley Publishing Co. pp. 20-23, 1991.

Kassakian et al., "Discrete-Time or Sampled-Data models," Principles of Power Electronics, Addison-Wesley Publishing Co., Chapter 12, Sec. 12.5, pp. 313-315, 1991.

Kassakian et al., "Dynamics and Control: An Overview," Principles of Power Electronics. Addison-Wesley Publishing Co., Chapter 11, pp. 253-298, 1991.

Kassakian et al., "Feedback Control Design," Principles of Power Electronics, Addison-Wesley Publishing Co., Chapter 14. pp. 365-402, 1991.

Kassakian et al., "High-Frequency Switching dc/dc Conveners," Principles of Power Electronics, Addison-Wesley Publishing Co., Chapter 6, pp. 103-137, 1991.

Klein, Jon (2000) "Bumped-wafer technology meets MOSFET challenges," retrieved from Electronic Poducts.com at <http://www2.electronicproducts.com/printarticle.aspx?articleURL+SEPFAI1.SEP2000>, downloaded from internet on May 4, 2009, 4 pgs.

Koburger, C., et al. (1994) "Simple, Fast, 2.5-V CMOS Logic with 0.25-μm Channel Lengths and Damascene interconnect," 1994 Symposium on VLSI Technology Digest of Technical Papers, 7A.3, 0-7803-19212-4/94-IEEE, 2 pgs. [1033-1034].

Kukrer, Osman (1996) "Discrete-Time Current Control of Voltage-Fed Three-Phase PWM," IEEE Trans on Power Electronics, vol. 11, No. 2, Mar. 1996, 10 pgs. [1597-1606].

Kurata et al. (2000) "Over-coated Flip-chip Fine Package Development for MCM Fabricated with Si IC and GaAs MMIC," 2000 IEEE, Electronic Components and Technology Conference, No. 0-7803-5911-9/00, 6 pgs.

Kurata et al. (2001) "Dual Operational Amplifier using Flip-cup Fine Package of 1.0×1.0.×0.6-mm with 8-pin counts," 2001 IEEE, Electronic Components and Technology Conference, No. 0-7803-7038-4/01, 5 pgs.

Lau, John H. et al. Electronic Packaging: Design, Materials, Process, and Reliability, McGraw-Hill, 1998, pp. 13-14.

(56) References Cited

OTHER PUBLICATIONS

Lau, John el al., Electronic Packaging, Design, Materials, Process and Reliability, McGraw-Hill, 1998, ISBN 0-07-037135-0. (262 pages).
Lau, John H. "Cost Analysis: Soldier Bumped Flip Chip Versus Wire Bonding", IEEE Transactions on Electronics Packaging Manufacturing, vol. 23, No. 1, Jan. 2000, pp. 4-11.
Lau, John H. editor, Flip Chip Technologies, McGraw Hill, 1995 pp. 26-28, 411-413, 499-515, 526-527.
Lau, John H. editor, Handbook of Tape Automated Bonding, Van Nostrand Reinhold, 1992, ISBN 0-442-00427-3 (336 pages).
Lau, John H. Flip Chip Technologies, McGraw-Hill, 1996, ISBN 0-07-036609-8 (298 pages).
Lau, John H. Low Cost Flip Chip Technologies for DCA, WLCSP, and PBGA Assemblies, McGraw-Hill, 2000, ISBN 0-07-135141-8. (307 pages).
Lau, John H. Ed. (1994) "Chip on Board Technologies for Multichip Modules," Chapman & Hall, New York, BY, International Thompson Publishing. ISBN 0442014414. 1994. (299 pgs).
Li, Jieli et al. (2004) "Using Coupled Inductors to Enhance Transient Performance of Multi-Phase Buck Convereters," *2004 IEEE*, No. 0-7803-8269-2/04, 1289-1203, 5 pgs. [2051-2055].
Lidsky, D. and Rabaey J.M. (1994) "Low Power Design of Memory Intensive Functions Face Study: Vector Quantization," *1998 IEEE*, No. 0-7803-2123-5/94, 10 pgs. [1639-1646].
Lidsky, D. and Rabaey J.M. (1996) "Early Power Exploration—A World Wide Web Application," AMC, Inc., 33$^{rd}$ Design Automation Conference, DAC94-06/96, ACM 0-89791-779-0/96/0006, 6 pgs. [1621-1626].
Lidsky, D. and Rabaey, J.M. ( 1994) "Low-Power Design of Memory Intensive Functions," 1994 IEEE Symposium on Low Power Electronics, No. 2.4, 2 pgs [1647-1648].
Lidsky, David B. "The Conceptual-Level Design Approach to Complex Systems", (Fall 1998) (unpublished M.S. dissertation, University of California, Berkeley) (on file with author), pp. 1-220.
Liffring, Mark ( 1985) "Spice Compatible Sampled-Data Models for Switching Regulators," Society of Automotive Engineers. Inc., SAE/ P•85/164. 6 pgs [1649-1654].
Linear Technology (1993) "High Efficiency Synchronous Step-Down Switching Regulators," (product description brochure) LTC1148, LTC1148-3.3/LTC1148-5, 2 pgs. [1273-1274].
Linear Technology, "Offline Switching Regulator", (product description brochure) LT1103/LT1105, Rev. D 2K, Linear Technology Corporation 1992, 32 pages [1241-1272].
Liu et al. (2000) "Chip-Scale Packaging of Power Devices and its Application in Integrated Power Electronics Modules," *2000 IEEE*, Electronic Components and Technology Conference. No. 0-7803-5911-9/00, 8 pgs.
Liu, Xingsheng (2001) "Processing and Reliability Assessment of Solder Joint Interconnection for Power Chips," Dissertation submitted to Virginia Polytechnic Institute and State University, Feb. 27, 2001. pp. i-xxvii and 1-265.
Liu, Xingsheng, et al. "Chip-Scale Packaging of Power Devices and Its Application in Integrated Power Electronics Modules," IEEE Transactions on Advanced Packaging, vol. 24, No. 2, May 2001, 1521-3323(01)04492-6. 10 pgs. Downloaded on May 5, 2009.
Liu, Xingsheng, et al. "Three-Dimensional Flip-Chip on Flex packaging for Power Electronics Applications," IEEE Transactions on Advanced Packaging, vol. 24, No. 1, Feb. 2001. 1521-3323(01)00558-5. 9 pgs. Downloaded on May 4, 2009.
Loriferne, Bernard (1982) "Analog-Digital and Digital-Analog Conversion," Heyden & Son. Ltd., No. ISBN 0-85501-497-0 4 pgs. [1655-1658].
Mao, R.S. et al. (1992) "A New On-Chip Voltage Regulator for High Density CMOS DRAMS," 1992 Symposium on VLSI Circuits Digest of Technical Papers, 11-2,1992 IEEE 92CH3173-2/92/0000-0108, 2 pgs [1659-1660].
Martin, T.W. and Ang, S.S. (1995) "Digital Control for Switching Converters," IEEE Symposium on Industrial Electronics, vol. 2 of 2, Jul. 10-14, 1995, 6 pgs [1661-1666].

Mawardi, O. K. et al., "High Voltage Superconducting Switch for Power Application," IEEE Transactions of Magnetics, vol. Mag-19, No. 3, May 1983, pp. 1067-1070.
Maxim (1994) "Triple-Output Power-Supply controller for Notebook computers," MAX782, Maxim Integrated Products (brochure) 19-0146; Rev. 2, Jun. 1997, 2 pgs, [1300-1301].
Maxim (1997) "High-Speed Step-Down Controllers with Synchronous Rectification for CPU Power," MAX1624/MAX1625, Maxim Integrated Products (brochure) 19-1227; Rev. 1, Jun. 1997, 25 pgs [1275 -1299].
Maxim, "Digitally Adjustable LCD Bias Supply," MAX749, Maxim Integrated Products (brochure) 19-0143; Rev. 1: 2/95, Feb. 1995, pp. 1-12.
McGraw-Hill Dictionary of Electronic and Electrical Engineering, McGraw-Hill Book Company, 1984, p. 164—flasher through flip chip; p. 165—flip call through flutter echo; p. 220—instantaneous companding through insulation; p. 221—insulation coordination through intensifier electrode. (5 pages).
McGraw-Hill Dictionary of Electronic and Electrical Engineering, McGraw-Hill Book Company, 1984, pp. 164 and 221. (6 pages).
McGraw-Hill Dictionary of Scientific and Technical Terms, Fourth Edition, 1989, p. 556—disconformity through dishpan experiment. (4 pages).
McGraw-Hill Dictionary of Scientific and Technical Terms, McGraw-Hill Book Company, fifth edition, 1994, p. 1027. (5 pages).
McGraw-Hill Electronics Dictionary, Fifth Edition, John Markus and Neil Sclater Editors, 1994, p. 65—BT-cut crystal through bulk eraser; p. 110—concentric transmission line through confidence interval; p. 114—continuous X-rays through control system; p. 119—counter circuit through coupling coefficient; p. 207—FES through field-effect transistor; p. 230+gas-cell frequency standard through gate; p. 231—gate array through G display; p. 333—mesa transistor through metal-organic vapor-phase epitaxy; p. 494—solar flare through soldering iron; p. 573—VHF antenna through videocassette recorder; p. 578—voltage generator through voltmeter. (14 pages).
McGraw-Hill Electronics Dictionary, Fifth Edition, John Markus, Neil Sclater, 1984, p. 578—voltage generator through voltmeter; p. 494—solar flare through soldering iron. (5 pages).
Miller, L. F. (1969) "Controlled Collapse Reflow Chip Joining," IBM Components Division Laboratory, East Fishkill, NY, May 1969, pp. 239-250. 12 pgs.
Mitchell, Daniel (1988) "DC-DC Switching Regulator Analysis," Basic Switching Regulator Topologies, p. 9, ISBN 0-07-042597-3, McGraw Hill, Inc., 1988, 3 pgs. [1667-1669].
Mospower Applications Handbook, Robin Berliner Editor, 1984, Siliconix Incorporated, pp. 2-3.
Motorola (1996) "DC-to-DC Converter Control Circuits," Motorola, Inc. ((product description brochure) MC34063A/D MC33063A, Rev. 5, 13 pgs [1302-1314].
Motorola, Linear/Switchmode Voltage Regulator Handbook, 1989, pp. 95-100.
Muraoka, Kimihiro et al., "Characteristics of the High-Speed SI Thyristor and Its Application to the 60-kHz 100-kW High-Efficiency Inverter," IEEE Transactions on Power Electronics, vol. 4, No. I, Jan. 1989, pp. 92-100.
Murari, Bruno et al. "Smart Power ICs: Technologies and Applications", Itoh, K. et al. editors, Springer Series in Advanced Microelectronics, Springer 2002 (a corrected printing of the 1$^{st}$ edition from 1996), pp. 483-506.
Muller, Richard S. et al., Device Electronics for Integrated Circuits, John Wiley & Sons, second edition, 1986, pp. 106-107.
Muller, Richard S. Device Electronics for Integrated Circuits, Second Edition, John Wiley & Sons Inc. 1977, ISBN 0-471-88758-7. (276 pages).
Mutoh, Shin'ichiro et al., "Design Method of MTCMOS Power Switch for Low-Voltage High-Speed LSIs," Design Automation Conference, 1999. Proceedings of the ASP-DAC '99. Asia and South Pacific Jan. 18-21, 1999, 113-116 vol. 1.
Narayanaswamy, S. et al. (1996) "A low-power, lightweight unit to provide ubiquitous information access Application and Network Support for InfoPad," IEEE Personal Communications, Apr. 1996, 4-17, 14 pgs. [913-926].

(56) References Cited

OTHER PUBLICATIONS

Namgoong, Won, et al., "SP23.2: A High-Efficiency Variable-Voltage CMOS Dynamic dc-de Switching Regulator," IEEE International Solid-Slate Circuits Conference 1997, pp. 381-381 and 489.
National Semiconductor Corporation, "LM2650 Synchoronus Step-Down DC/DC Converter", Jun. 1999. (11 pages).
National Semiconductor, "LM1575/LM2575/LM2575HV: Simple Switcher® 1 A Step-Down Voltage Regulator," National Semiconductor Corporation, Apr. 2007. (28 pages).
National Semiconductor, LM2650 Synchronous Step-Down DC/DC Convener, Jan. 1997, (12 pages).
National Semiconductor, News Release, "National Semiconductor Announces Industry's First 3 AMP Monolithic Synchronous Battery Switcher with Greater than 96% Efficiency", downloaded on Jul. 30, 2009 from http://www.national.com/news/1996/9609/1m26S0.html, (2 pages).
National Semiconductor: The Sight & Sound of Information, "Considerations in Converting from SMT to Die Assemblies," National Semiconductor Technical Seminar Series, Die Product Business Unit, Jun. 26, 2003. (38 pages).
Nelson, Carl (1986) "LT1070 Design Manual," Linear Technology Application Note 19, Jun. 1986, No. AN1901, 3 pgs [856-858].
New Webster's Dictionary of the English Language, College Edition, 1975, p. 448—disconcerted through discrepancy; p. 821—jupan through jute; p. 1137—plainsman through plane tree; p. 1786—witchery through without. (7 pages).
Nielsen, Lars S. et al., "Low-Power Operation Using Self-Timed Circuits and Adaptive Scaling of the Supply Voltage," Special Issue Papers, IEEE Transactions on Very Large Scale Integration (VLSI) Systems, vol. 2, No. 4, Dec. 1994, pp. 391-397.
O'Malley, Grace. "The Importance of Material Selection for Flip Chip on Board Assemblies", IEEE Transactions on Components, Packaging, and Manufacturing Technology, Part B, vol. 17, No. 3, Aug. 1994, pp. 248-255.
Paik, Kyung-Wook et al., "A Study on Reliability of Flip-Chip Solder Joints Using Pb-Free Solders and Electroless Ni-P UBMs," Proceedings, SMTA Pan Pacific Symposium, 2005. (7 pages).
Paulasto, Mervi and Hauck, Torsten. "Flip Chip Die Attach Development for Multichip Mechatronics Power Packages," Motorola GmbH, Advanced Interconnect Systems Laboratory—Europe, Munchen, Electronics manufacturing Technology Symposium, 1999. Twenty-Fourth IEEE/CPMT, Oct. 18, 1999-Oct. 19, 1999. 0-7803-5502-4/99. 7 pgs. Downloaded on May 5, 2009.
PCT International Preliminary Examination Report dated Mar. 28, 2002 issued in PCT/US2001/03756 (WO2001-57608) [1670-1674].
PCT International Search Report dated May 17, 2001 issued in PCT/US2001/03756 (WO2001-57608) [1670-1674].
Pehlke, D.R. et al. (1997) "Extremely High-Q Tunable Inductor for Si-Based RF Integrated Circuit Applications," 1997 IEEE, 64 IEDM 97-63, 3.4.1, Dec. 7-10, 1997, 4 pgs [927-930].
Pehlke, D.R. et al. (1998) "High-Frequency Application of MOS Compact Models and their Development for Scalable RF Model Libraries," 1998 IEEE Custom Integrated Circuits Conference, 1998, 219-222, 4 pgs. [931-934].
Petr, R. A., et al., "Switching performance of a cryogenic silicon photoconductive power switch," J. Appl. Phys. 63 (8), Apr. 15, 1988, American Institute of Physics, pp. 2839-2847.
Pienimaa, S. and Martin, N. (2001) "High Density Packaging for Mobile Terminals," 2001 IEEE, Electronic Components and Technology Conference, No. 0-7803-73084/01, 8 pgs.
Poulton, Ken et al. (2002) "A 4GSample/s 8b ADC in 0.35μm CMOS," 2002 IEEE International Solid-State Circuits Conference, 2002, Session 10, High-Speed SDCs, 10.1, 3 pgs. [889-891].
Poulton, Ken et al. (2002) "A 4GSample/s 8b ADC in 0.35μm CMOS," 2002 IEEE International Solid-State Circuits Conference, 2002, Session 10, High-Speed SDCs, 10.1, Visual Supplement, 5 pgs. [953-957].
Primarion, "PX7510: Single-phase Digital Integrated Power Conversion & Management IC," Di-POL™, Product Brief, Nov. 17, 2006. (2 pages).
Primarion® Power Code™, "Digital Multiphase Chipset*," Primarion® Wideband Power Products, Product Brief 2003. (2 pages).
Pulvirenti, F. et al. "Charger Power Switch for Mobile Phones", Analog and Mixed IC Design, 1997. Proceedings, 1997 $2^{nd}$ IEEE-CAS Region 8 Workshop on, Sep. 12-13, 1997, pp. 97-100.
Razavi, Behzad (1995) "Principles of Data Conversion System Design," IEEE Circuits and Systems Society, IEEE Press, No. PC4465, 5 pgs [1676-16080].
Renesas, "R2120602NP: Integrated Driver—MOS FET (DrMOST)," Renesas Technology Corp., Fact Sheet Rev. 4.00, Feb. 9, 2009. (15 pages).
Sevcon Limited, Patent Application No. 9724597.1, Nov. 20, 1997, entitled "Controller for Battery-Operated Vehicle".
Rinne et al. (2002) "Electromigration in WLCSP Solder Bumps," Unitive, Inc., Research Triangle Park, North Carolina. International symposium on microelectronics, Denver, Colorado, Apr. 9, 2002, vol. 4931, pp. 662-667. 6 pgs.
Saint, Christopher and Judy (2002) "IC Layout Basis, A Practical Guide," McGraw-Hill, No. ISBN 0-07-138625-4, 5 pages [1681-1685].
Salazar, Lautaro D. and Ziogas, Phoivos D. "A High Frequency Two-Switch Forward Converter with Optimized Performance," Industrial Electronics Society, 1989. IECON '89., 15th Annual Conference of IEEE, vol. 1, Nov. 6-10, 1989, pp. 60-66.
Schiffer, Brian et al. (1998) "An Active-Charge Cancellation System for Switched-Capacitor Sensor Interface Circuits," *IEEEE ISSCC98*, Session 17, Sensor Technology, SA 17.2, 2 pgs. [911-912].
Schiffer, Brian et al. (1998) An Active Charge Cancellation System for Switched-Capacitor Sensor Interface Circuits, IEEE Journal of Solid-State Circuits, vol. 33, No. 12, Dec. 1998, 2134-2137, 5 pgs [906-910].
Schofield, Hazel, et al. "FlipFET™ MOSFET Design for High Volume SMT Assembly", Mar. 19, 2001, International Rectifier, 6 pages.
Schubert, Andreas et al. Do Chip Size Limits Exist for DCA?, IEEE Transactions on Electronics Packaging Manufacturing, Oct. 1999 vol. 22, No. 4, pp. 255-263.
Seitzer, Dieter et al. (1983) "Electronic Analog-to-Digital Converters," John Wiley & Sons, No. ISBN 0 471 90198.9, 3 pgs [1690-1692].
Seraphim, Donald P. et al. Principles of Electronic Packaging, McGraw-Hill, 1989 pp. 595-598.
Severns, R.P. and Bloom, Ed (1985) "Modern DC_To_DC Switchmode Power Converter Circuits," Van Nostrand Reinhold Company, No. ISBN: 0-442-211396-4, 4 pgs [1693-1696].
Sherman, J.D. and Walters, M. (1996) "Synchronous Rectification: Improving the Efficiency of Buck Converter," EDN.com, Mar. 14, 1996, archives at http://www.edn.com/archives/I996/031496/06df4.htm, No. EDN- 03.14.96, 5 pgs, [1697-1701].
Siliconfareast.com, "Chip-on-Board (COB); Direct Chip Attachment (DCA)," http://www.siliconfareeast.com/cob.htm, downloaded 03/0312010. (3 pages).
Skyes, Frederick E. "Resonant-Mode Power Supplies: A Primer", 0018-9235/89/0500-0036, IEEE Spectrum, May 1989, vol. 26, Issue 5, pp. 36-39.
Smith, Trevor A. et al, "Controlling a DC-Dc Converter by Using the Power MOSFET as a Voltage Controlled Resistor," IEEE Transactions on Circuits and Systems-I: Fundamental Theory and Applications, vol. 47, No. 3, Mar. 2000, pp. 357-362.
Soclof, Sidney. Analog Integrated Circuits, Prentice-Hall, Inc., 1985, ISBN 0-13-032772-7. (264 pages).
Soclof, Sidney. Analog Integrated Circuits. Prentice-Hall Series in Solid State Physical Electronics, Prentice Hall, Inc. 1985. 264 pages.
Soman, Vijay (1998) "Thermal Design Considerations-EL75XX," Intersil, Application Note. Mar. 20, 1998, No. AN1096 6 pgs. [834-839].
Sprock, Doug and Hsu, Ping (1997) "Predictive Discrete Time Control of Switchmode Applications," Dept. of Elec. Eng., 1997 IEEE, pp. 175-181, No. 0-7803-3840-5/97, 7 pgs. [1702-1708].
Sridharan, G. Oct. 1990. "Transformerless DC/DC Converter for Production of High Voltage," downloaded on Dec. 11, 2008 from IEEE Xplore, by licensed user, 3 pgs. [1709-1711].

(56) References Cited

OTHER PUBLICATIONS

Stratakos, Anthony J. (1998) "High• Efficiency Low-Voltage DC-DC Conversion for Portable Applications," Dissertation No. UMI 9923062, Univ. CA, Berkeley, Dec. 2, 1998, 251 pgs. [1800-2050].

Stratakos et al., "DC Power Supply Design in Portable Systems," Electronics Research Laboratory, Memorandum No. MCB/ERL M95/4, Jan. 19, 1995 (Revised Apr. 26, 1995), pp. 1-62.

Stratakos, et al. (1994) "A Low-Voltage CMOC DC-DC Converter for a Portable Battery-Operated System," 1994 IEEE, No. 0-7803-1859-5/94, 6 19-626, 8 pgs. [1722-1729].

Stratakos, et al., Coauthored. Chapter 5, "DC Power Supply Design in Portable Systems," University of California, Berkeley, pp. 141-180, in Chandrakasan, Anantha P. and Brodersen, Robert W., Low Power Digital CMOS Design, Kluwer Academic Publishers, Norwell, MA, USA, 1995. ISBN 079239576X, 40 pages.

Smith, T. A. and Dimitrijev, S. "Using the On-Resistance of a Power MOSFET to Control a DC-DC Convener," Circuits and Systems, 1998. IEEE APCCAS 1998. The 1998 IEEE Asia-Pacific Conference on, Nov. 24-27, 1998, pp. 731-733.

Steyn, C.G. and D. van Wyk, Jacobus. "Study and Application of Nonlinear Turn-Off Snubber for Power Electronic Switches", IEEE Transactions on Industry Applications, Vo. 1A-22, No. 3, May 1986, May/Jun. 1986, pp. 471-477.

Takahashi, Yasuo and Gang, Tie. "Microjoining Process in Electronic Packaging and Its Numerical Analysis," Transactions of Joining and Welding Research Institute, vol. 30, (2001), No. I, pp. 1-11.

Takamura et al. (2000) "Low-thermal-resistance Flip-chip Fine Package for 1-W Voltage Regulator IC," *2000 IEEE/CPMT*, Intn'l Electronics Manufacturing Technology Symposium, No. 0-7803-6482-1/00, pp. 305-310. 6 pgs.

Taketani et al. (1996) "CSP with LOC Technology," Hitachi Cable Ltd, Hitachi-shi, Ibaraki-ken, Japan. Proc. Proceedings of SPIE—the International Society for Optical Engineering; v. 2920, Proceedings of the 1996 International Symposium on Microelectronics. Oct. 1996. 6 pgs.

Tessier, Ted and Scott, Doug, editors, Bumping Design Guide, Flip Chip International LLC, May 2009. (53 pages).

Tessera: System Building Block, "The Tessera µBGA package," Product Description. 1994. (12 pages).

Texas Instruments, Inc. (1999) "Low-Dropout Voltage Regulators with Integrated Delayed Reset Function," TPS730IQ, TPS7325Q, TPS7330Q, TPS7333Q, TPS7348Q, TPS7350Q, SLVS124F-6/95, Production Data (brochure), Jan. 1999, 46 pgs [1315-1360].

The American Heritage Dictionary, Second College Edition, 1982, p. 817—motionless through mountaineer; p. 1384—wind instrument through wing footed. (5 pages).

The authoritative Dictionary of IEEE Standards Terms, Seventh Edition, IEEE, 2000, p. 275—day night sound level through d-display. (6 pages).

The IEEE Standard Dictionary of electrical and Electronics Terms, Sixth Edition, IEE Std 100-1996, 1996, p. 313—done correct through dose equivalent; p. 536—integer arithmetic through integrated circuit; p. 537—integrated Civil Engineering System through integration loss; p. 557—isochronous service octet through isolation; p. 650—metal—enclosed power switchgear through metal-oxide semiconductor; p. 808—power selsyn through power transfer relay; p. 818—principal voltage through print server; p. 1054—strip-type transmission line through structure chart; p. 1059—substitute character through subtransient internal voltage. (12 pages).

The IEEE Standard Dictionary of electrical and Electronics Terms, Sixth Edition, IEEE Std 100-1996, 1996, p. 313—done correct through dose equivalent; p. 536—integer arithmetic through integrated circuit; p. 537—integrated Civil Engineering through integration loss; p. 544—interlacing impedance voltage through intermediate frequency; p. 557—isochronous service octet through isolation; p. 650—metal-enclosed power switchgear through metal-oxide semiconductor; p. 734—output signal through overcurrent; p. 808—power selsyn through power transfer relay; p. 818—principal voltage through print servet; p. 1054—strip-type transmission line through structure chart; p. 1059—substituted character through subtransient internal voltage; p. 1095—10BASE2 through terminal; p. 1096—terminal adapter the terminal, remote. (20 pages).

The New IEEE Standard Dictionary of Electrical and Electronics Terms [Including Abstracts of All current IEEE Standards], 1993, p. 802—metal-enclosed 1000 volts through metallic rectified; p. 803—metallic rectifier cell through meter installation inspection; p. 995—power service protector through power system stabilizer. (5 pages).

Tsen, T. et al., "A Low Power 16K GaAs HIMESFET static RAM with Built-in Redudancy," Gallium Arsenide Integrated Circuit (GaAs IC) Symposium, 1990, Oct. 7-10, 1990, pp. 155-157, Technical Digest 1990, 12$^{th}$ Annual Rockewell International Corporation MTC/CSP, GaAs IC Symposium, pp. 155-157.

Tsui et al. (2000) "Advanced Packaging Technologies in MOSFETs for Power Management," 2000 IEEE, Electronic Components and Technology Conference, No. 0-7803-5911-9/00, 4 pgs.

Tsui, Anthony et al. "Direct Interconnect: New MOSFET Package Cuts On-Resistance" PCIM Power Electronic Systems, Aug. 1999 pp. 20-30.

Tu, Lishan et al., "Performance Characteristics of the Combined Zero-Voltage Switching Inverter with the Auxiliary Input-Current Controller," Proceedings of the Power Conversion Conference—Nagaoka 1997., Aug. 3-6, 1997, vol. 2, 827-830 0/803-3823-5/97, IEEE 1997, pp. 827-830.

Tummala, R. R. et al., editors, Microelectronics Packaging Handbook, Part II: Semiconductor Packaging Chapman & Hall, 2nd edition 1997, pp. 111-119, 935-937.

Tummala, R. R. editor, Microelectronics Packaging Handbook, Van Nostrand Reinhold, 1989, pp. 364-373.

University of California Technology Transfer, UC Patent Policy 1985, Effective Nov. 18, 1985, http://www.ucop.edu/ott/genresources/pat-pol_97.html. (4 pages).

U.S. Appl. No. 09/498,297, Burstein et al., filed 214/00, issued as USP 6278264; USPTO File History.

U.S. Appl. No. 09/892,233, Burstein et al., filed 6126/01, issued as USP 6462522; USPTO File History.

Varosi, S. M. et al., "A Simple Remote-Controlled Power Switch for Internalized Bioelectronic Instrumentation," IEEE Transactions on Biomedical Engineering, Aug. 1989, vol. 36, Issue:8, pp. 858-860.

van der Broek, H. W., et al. "On the Steady-State and Dynamic Characteristics of Bipolar Transistor Power Switches in Low-Loss Technology", Electric Power Applications, IEEE Proceedings B 132, Sep. 1985 vol. 132, Issue 5, pp. 251-259 IEEE Proceedings, vol. 132, Pt. B, No. 5, Sep. 1985 pp. 251-259.

van Heijningen, M. and Priday, 1. "Novel Organic SMD Package for High-Power Millimeter Wave MMICs," 34th European Microwave Conference, Amsterdam, Oct. 11-15, 2004, pp. 357-360.

Wan, Marlene et al. (1998) "An Energy Conscious Methodology for Early Design Exploration of Heterogeneous DSPs," 1998 IEEE Custom Integrated Circuits Conference Sec 7.1.1, 8 pgs. [1613-1620].

Webster's Ninth New Collegiate Dictionary, 1991, p. 1176—subscript through substitutable. (3 pages).

Wei, Gu-Yeon and Horowitz, Mark, "A Low Power Switching Power Supply for Self-Clocked Systems," Computer Systems Laboratory. Stanford University, CA, funding provided under ARPA, contact #J-FBI-92-194, ISLPED 1996 Monterey, California, 5 pgs [4822-4826].

Wikipedia, the free encyclopedia, "Pentium III," http://en.wikipedia.org/wiki/Pentium_III, last modified Nov. 16, 2007. (6 pages).

Wilcox, J. R. "Package Interconnects" (presentation) IBM Corporation, Jan. 2006, pp. 1-108.

Williams, Jim and Huffman, Brian (1988) "Switched-capacitor networks simplify dc-dc converter designs (technical)," EDN. retrieved from the Internet at http://www.highbeam.com/DocPrint.aspc/DocID=1G1:7220705, downloaded Nov. 18, 2008, 3 pgs. [4833-4835].

Williams, Richard and Blattner, Robert (1993) "Benefits of OM OS Voltage Scaling on Synchronous Buck regulator Efficiency," 1993 IEEE, No. 0-7803-1313-5/93/0000-146, 146-151, 6 pgs. [4827-4832].

Wong, Mike (1998) Designing a high Efficiency DC-DC Converter with the EL75XX, Intersil, Application Note, Mar. 24, 1998, No. AN1101, 16 pgs [840-855].

(56) References Cited

OTHER PUBLICATIONS

Zhou, Xunwei (1999), "Low-voltage High-efficiency Fast-transient Voltage Regulator Module," Dissertation submitted to Virginia Polytechnic Institute and State University, Jul. 1999. DD. i-xiv and 1-211 (226 pgs).
Dancy, Abram P., "Power Supplies for Ultra Low Power Applications", submitted to the Department of Electrical Engineering and Computer Sciences on Aug. 30, 1996, in partial fulfillment of the requirements for the degree of Master Engineering, pp. 81-103 (32 pages).
Cho, et al., "Design Considerations for High-Speed Low-Power, Low-Voltage CMOS Analog-to-Digital Converters", Department of Electrical Engineering and Computer Sciences, University of California at Berkeley; Digest of Technical papers.
Clough, Sherry L., Thesis "Flip Chip Attachment Methods: A Methodology for Evaluating the Effects of Supplier Process Variation and Supplier Relationships on Product Reliability", B.S.E. Industrial and Operations Engineering, University of Michigan, submitted to the Sloan School of Management and the Dept. of Materials Science Engineering on May 8, 1998, 110 pages.
New Webster's Dictionary of the English Language, College Edition, 1975, p. 118—balderdash through ballerina; p. 1146—plumbism to pluriaxial; p. 1374—sentence to sept. (6 pages).
Intel®, "Pentium® III Processor for the PGA370 Socket at 500 MHz to 1.13 GHz", Datasheet, Revision 8, Jun. 2001 Document No. 245264-08, (94 pages).
McGraw-Hili Dictionary of Scientific and Technical Terms, McGraw-Hill Book Company fifth edition, 1994, p. 1027 (5 pages).
The New IEEE Standard Dictionary of Electrical and Electronics Terms [Including Abstracts of All current IEEE Standards], 1993, p. 802—metal-enclosed 1000 volts through metallic rectifier; p. 803—metallic—rectifier cell through meter installation inspection; p. 995—power service protector through power system stabilizer. (5 pages).
PCT International Search Report dated May 17, 2001 issued in PCT/US2001/03756 (W02001-57608) [161,0-1674].
Goodman, James et al. (1998) "An Energy/Security Scalable Encryption Processor Using an Embedded Variable Voltage DC/DC Converter," *IEEE Jrnl of Solid-State Circuits*, vol. 33, No. 11, 1799-1809 Nov. 1998, 11 pgs [1390-1400].
Liu, Xingsheng (2000),"Processing and Reliability Assessment of Solder Joint Interconnection for Power Chips," Dissertation submitted to Virginia Polytechnic Institute and State University, Feb. 27, 2001. pp. i-xxvii and 1-265.
Paulasto, Mervi and Hauck, Torsten, "Flip Chip Die Attach Development for Multichip Mechatronics Power Packages," Motorola GmbH, Advanced Interconnect Systems Laboratory—Europe, Munchen, Electronics Manufacturing Technology Symposium, 1999. Twenty-Fourth IEEE/CPMT, Oct. 18, 1999-Oct. 19, 1999.0-7803-5502-4/99. 7 pgs. Downloaded on May 5, 2009.
Riley, George A., Tutorial 11, Under Bump Metallization (UBM) [online], Sep. 2001 [retrieved on Jun. 13, 2011]. Retreived from the Inter: http://www.flipchips.com/tutorial11.html, 5 pages.

Webster's Third New International Dictionary of the English Language Unabridged, Merriam-Webster Inc., Publishers, 1993, p. 63—altaic through altitude; p. 485—consonancy through constellate; p. 493—continental through continuous; p. 494—continuous beam through contraction; p. 646—discomycete through discourage; p. 1275—last day through lateral line; p. 1476—mottled through mount; p. 1477—mount through mountain pride; p. 1575—on through one; p. 1730 plan through planful; p. 1730—plan through planful; p. 1745—plunge through plutonic; p. 1826—protozoacidal through provenience; p. 2300—sureness through surgeon general; p. 2620—windfallen through wind-shaken; p. 2627—wither through witted. (19 pages).
Webster's third New International Dictionary of the English Language, Unabridged, Merriam-Webster Inc., Publishers, 1993, p. 63—altaic through altitude; p. 120—Arnhem through array; p. 121—arrayal through arrowhead; p. 480—conjugal bliss through connected load;p. 493—continental drift through continuous; p. 494—continuous beam through contraction; p. 722—ed. Through edict; p. 804—expurgation through extension; p. 811—F through face; p. 1275—last day through lateral line; p. 1476—mottled through mount; p. 1477—mount through mountain pride; p. 1575—on through one; p. 1618—packet through pad; p. 1619—pad through paedomorphism; p. 1730—plan through planful; p. 1730—plan through planful; p. 1745—plunge through plutonic; p. 1826—protozoacidal through provenience; p. 2280—substandard through subsumption; p. 2500—union card through united front; p. 2620—windfallen through wind-shaken; p. 2627—wither through witted. (28 pages).
Claim Construction Order, Case No. CV-08-5129 JCS, United States District Court, Northern District of California, San Francisco Division, Feb. 22, 2010, 71 pages.
Declaration of Dr. Thomas Szepesi in Support of Volterra's Opening Claim Construction Brief, Case No. CV-8-5129 JCS, United States District Court, Northern District of California, San Francisco Division, Oct. 22, 2009, 38 pages.
Redacted Plaintiff Volterra Semiconductor Corporation's Opening Claim Construction Brief, Case No. CV-8-5129 JCS, United States District Court, Northern District of California, San Francisco Division, Oct. 22, 2009, 29 pages.
Redacted Volterra Semiconductor Corporation's Reply Claim Construction Brief, Case No. CV-08-5129 JCS, United States District Court, Northern District of California, San Francisco Division, Nov. 16, 2009, 19 pages.
Redacted Volterra Semiconductor Corporation's Supplemental Reply Claim Construction Brief, Case No. CV-8-5129 JCS, United States District Court, Northern District of California, San Francisco Division, Dec. 4, 2012, 22 pages.
U.S. Appl. No. 60/217,860, filed Jul. 13, 2000, 30 pages.
U.S. Appl. No. 90/009,436, filed Mar. 25, 2009, 453 pages.
Wu et al., "An Active Clamp Circuit for Voltage Regulation Module (VRM) Applications," IEEE Trans. on Power Electronics, vol. 16, No. 5, Sep. 2001, pp. 623-634.

* cited by examiner

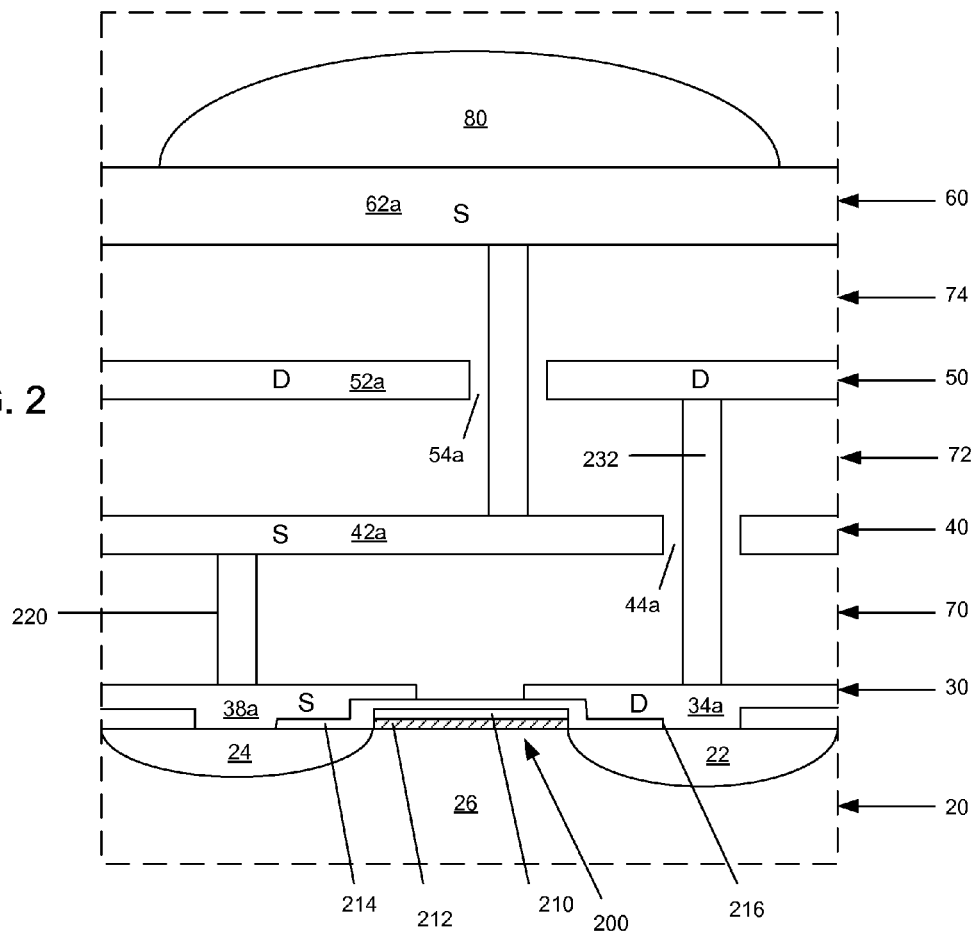
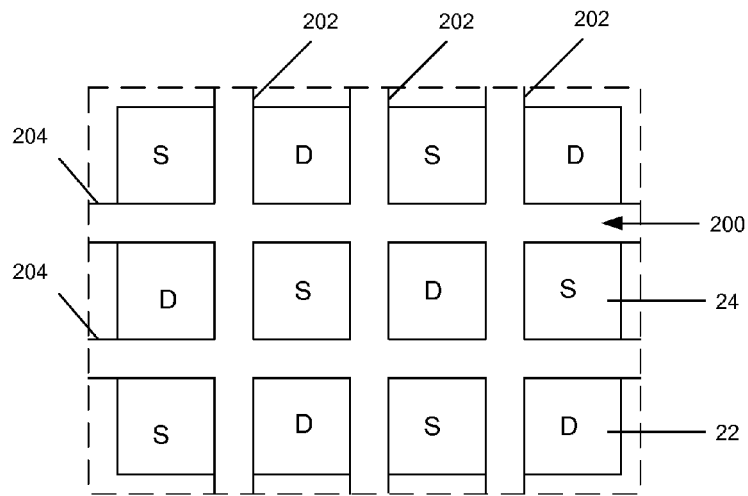

CONDUCTIVE ROUTINGS IN INTEGRATED CIRCUITS USING UNDER BUMP METALLIZATION

CROSS-REFERENCE TO RELATED APPLICATIONS

This application is a continuation of U.S. patent application Ser. No. 13/454,968, filed Apr. 24, 2012, which claims priority to and is a continuation of U.S. patent application Ser. No. 12/343,261, filed Dec. 23, 2008, which claims priority to U.S. Provisional Application Ser. No. 61/017,139, filed on Dec. 27, 2007, the entire disclosures of which are incorporated by reference.

TECHNICAL FIELD

The present invention relates generally to conductive routings in integrated circuits, and in one aspect, to conductive routings in integrated circuits used as power switches.

BACKGROUND

Integrated circuits ("IC"), which generally refer to electronic circuits formed on a silicon or other semiconductor substrate, have widespread application in modern electronic systems. An IC chip may contain circuit devices, such as transistors, and electrical interconnects to electrically couple the circuit devices. An outer surface of the IC chip may also contain conductive pads for providing electrical coupling of the chip to external devices, such as voltage sources and control circuits. Traditionally, electrical connection between the transistors in the semiconductive substrate and the conductive pads is accomplished through the use of multiple conductive layers that are formed over the semiconducting substrate of the integrated circuit chip but below an insulative layer that supports the conductive pads (an aperture in the insulative layer can provide electrical coupling of the contact pad to the uppermost conductive layer). For example, an integrated circuit chip may have metal lines and vias that electrically couple the source and drain regions of the transistors to the conducting pads of the integrated circuit chip.

Voltage regulators, such as DC to DC converters, are used to provide stable voltage sources for electronic systems. Switching voltage regulators are known to be an efficient type of DC to DC converter. Such voltage regulators typically include a power switch to generate a rectangular-wave voltage that is filtered to provide the output DC voltage.

Conventionally, the power switch was fabricated as an integrated circuit chip with wire bond packaging. More recently, the power switch has been fabricated as an integrated circuit chip with flip-chip packaging (in which solder bumps are placed on the top surface of the chip, and the chip is mounted upside down with the solder bumps connected directly to a printed circuit board, interposer, or to a package).

SUMMARY

In one aspect, an integrated circuit structure includes a first conductive layer and an under bump metallization layer over the first conductive layer. The first conductive layer has a first conductive region and a second conductive region electrically isolated from the first conductive region. The under bump metallization layer has a first conductive area and a second conductive area electrically isolated from the first conductive area, the first conductive area substantially located over the first conductive region and the second conductive area substantially located over the second conductive region. At least one of the first conductive area or the first conductive region includes a first protrusion extending toward the second conductive area or second conductive region, respectively. Conductive vias connect the first conductive region to the second conductive area and connect the second conductive region to the first conductive area, and the conductive vias include at least one via connected to the first protrusion.

Implementations can include one or more of the following features. The first conductive area may include the first protrusion extending toward the second conductive area. The first conductive region may include a second protrusion extending toward the second conductive region, and the conductive vias may include at least one via connected to the second protrusion. The first conductive region may include the first protrusion extending toward the second conductive region. A first flip-chip interconnect may be on the first conductive area of the under bump metallization layer, and a second flip-chip interconnect may be on the second conductive area of the under bump metallization layer. The first flip-chip interconnect and second flip-chip interconnect may be solder bumps, solder balls, copper pillars or stud bumps. The first conductive region may have a plurality of first protrusions extending toward the second conductive region, and the second conductive region may have a plurality of second protrusions extending toward the first conductive region. The first conductive area may have a plurality of third protrusions extending toward the second conductive area, and the second conductive area may have a plurality of fourth protrusions extending toward the first conductive area. A plurality of first conductive vias may connect the plurality of first protrusions to the plurality of fourth protrusions, and a plurality of second conductive vias may connect the plurality of second protrusions to the plurality of third protrusions. The first conductive area may have a plurality of first protrusions extending toward the second conductive area, and the second conductive area may have a plurality of second protrusions extending toward the first conductive area.

The under bump metallization may include a contact layer to contact a portion of the first conductive layer and an outer layer. An intermediate layer may be between the contact layer and the outer layer. The intermediate layer may include a diffusion-blocking material. The contact layer may include aluminum, the intermediate layer may include a nickel vanadium alloy, and the outer layer may include copper. The contact layer may be titanium and the outer layer may be copper. The outer layer may be a metal layer, e.g., copper, having a thickness greater than 6 microns.

The integrated circuit structure may further comprise a substrate under the first conductive layer. The substrate may have a first distributed transistor with a first plurality of doped source regions and a first plurality of doped drain regions, and the first conductive region and the second conductive area may be electrically coupled to the first plurality of doped source regions and the second conductive region and the first conductive area may be electrically coupled to the first plurality of doped drain regions. The first plurality of doped source regions and the first plurality of doped drain regions may be are arranged in an alternating pattern in the substrate. The substrate may have a second distributed transistor with a second plurality of doped source regions and a second plurality of doped drain regions arranged in an alternating pattern in the substrate. The first conductive layer may have a third conductive region and a fourth conductive region electrically isolated from the third conductive region. The under bump metallization layer may have a third conductive area and a fourth conductive area electrically isolated from the third conductive area, the third conductive area substantially located over the third conductive region and the second conductive area substantially located over the fourth conductive region. At least one of the third conductive area or the third conductive region may include a second protrusion extending toward the fourth conductive area or fourth conductive region, respectively. The conductive vias may connect the third conductive region to the fourth conductive area and connect the fourth conductive region to the third conductive area. The conductive vias may include at least one via connected to the second protrusion. The third conductive region and the fourth conductive may be electrically coupled to the second plurality of doped source regions and the fourth conductive region and the third conductive area electrically coupled to the second plurality of doped drain regions. The first conductive area may be electrically coupled to the third conductive area. The first conductive area may be electrically coupled to the fourth conductive area. Thee second conductive area may be electrically coupled to the fourth conductive area.

A second conductive layer may be between the first conductive layer and the substrate. The second conductive layer may include a plurality of first conductive portions and a plurality of second conductive portions disposed below the first conductive region, and may include plurality of third conductive portions and a plurality of fourth conductive portions disposed below the first conductive region. A third plurality of vias may connect the first conductive region to the plurality of first conductive portions, and a fourth plurality of vias may connect the second conductive region to the plurality of third conductive portions. A fifth plurality of vias may connect the first conductive area to the plurality of second conductive portions, and a sixth plurality of vias may connect the second conductive area to the plurality of fourth conductive portions. A first flip-chip interconnect may be on the first conductive area of the under bump metallization layer, a second flip-chip interconnect may be on the second conductive area of the under bump metallization layer, a third flip-chip interconnect may be on the third conductive area of the under bump metallization layer, and a fourth flip-chip interconnect may be on the fourth conductive area of the under bump metallization layer.

In another aspect, an integrated circuit structure includes a first conductive layer and a second conductive layer over the first conductive layer. The first conductive layer has a first conductive region and a second conductive region electrically isolated from the first conductive region. The second conductive layer has a first conductive area and a second conductive area electrically isolated from the first conductive area, the first conductive area substantially located over the first conductive region and the second conductive area substantially located over the second conductive region. Only one of the first conductive area or the first conductive region includes a first protrusion extending toward the second conductive area or second conductive region, respectively. Conductive vias connect the first conductive region to the second conductive area and connect the second conductive region to the first conductive area. The conductive vias include at least one via connected to the first protrusion.

Implementations can include one or more of the following features. The first conductive area may include the first protrusion extending toward the second conductive area. The first conductive region may include the first protrusion extending toward the second conductive region. The first conductive region may have a plurality of first protrusions extending toward the second conductive region, and the second conductive region may have a plurality of second protrusions extending toward the first conductive region. The first conductive area may have a plurality of third protrusions extending toward the second conductive area, and the second conductive area may have a plurality of fourth protrusions extending toward the first conductive area. A plurality of first conductive vias may connect the plurality of first protrusions to the plurality of fourth protrusions, and a plurality of second conductive vias may connect the plurality of second protrusions to the plurality of third protrusions. The first conductive area may have a plurality of first protrusions extending toward the second conductive area, and the second conductive area may have a plurality of second protrusions extending toward the first conductive area. The integrated circuit structure may include a substrate under the first conductive layer. The substrate may have a first plurality of doped source regions and a second plurality of doped drain regions, and the first conductive region and the second conductive area may be electrically coupled to the first plurality of doped source regions and the second conductive region and the first conductive area may be electrically coupled to the first plurality of doped drain regions.

In another aspect, an integrated circuit structure includes a first conductive layer, a second conductive layer under the first conductive layer, and an under bump metallization layer over the first conductive layer. The first conductive layer has a first conductive region and a second conductive region electrically isolated from the first conductive region. The second conductive layer includes a first conductive portion and a second conductive portion electrically isolated from the first conductive portion, the first conductive portion disposed below the first conductive region, the second conductive portion disposed below the second conductive region. The under bump metallization layer has a first conductive area and a second conductive area electrically isolated from the first conductive area, the first conductive area substantially located over the first conductive region and the second conductive area substantially located over the second conductive region. A first conductive via connects the first conductive area to the first conductive portion. The first conductive via passes through an aperture in and is electrically isolated from the first conductive region. Conductive vias connect the first conductive region to the second conductive area, connect the second conductive region to the first conductive area, connect the first conductive portion to the second conductive region, and connect the second conductive portion to the first conductive region.

Implementations can include one or more of the following features. A second conductive via may connect the second conductive area to the second conductive portion. The second conductive via may pass through an aperture in and be electrically isolated from the second conductive region.

In another aspect, an integrated circuit structure includes a first conductive layer, a second conductive layer under the first conductive layer, and an under bump metallization layer over the first conductive layer. The first conductive layer has a first conductive region and a second conductive region electrically isolated from the first conductive region. The second conductive layer has a first conductive portion and a second conductive portion electrically isolated from the first conductive portion, the first conductive portion disposed below and substantially overlapping the first conductive region, the second conductive portion disposed below and substantially overlapping the second conductive region. The under bump metallization layer has a first conductive area and a second conductive area electrically isolated from the first conductive area, the first conductive area disposed over and substantially overlapping the first conductive region and the second conductive area disposed over the second conductive region. At least one of the first conductive area, first conductive region or first conductive portion includes a protrusion extending toward the second conductive region, second conductive area or second conductive portion, respectively. Conductive vias connect the first conductive region to the second conductive area, connect the second conductive region to the first conductive area, connect the first conductive portion to the second conductive region, and connect the second conductive portion to the first conductive region. The conductive vias including at least one via connected to the protrusion.

In another aspect, an integrated circuit structure includes a first conducive layer and an under bump metallization layer over the first conductive layer. The first conductive layer has a first conductive region and a second conductive region electrically isolated from the first conductive region, the first conductive region having a first protrusion extending toward the second conductive region. The under bump metallization layer has a first conductive area and a second conductive area electrically isolated from the first conductive area. The first conductive area is substantially located over the first conductive region and the second conductive area is substantially located over the second conductive region. The first conductive area has a second protrusion extending toward the second conductive area. A first conductive via connects the first protrusion to the second conductive area, and a second conductive via connects the second protrusion to the second conductive region.

Advantages may include the following. The lengths of conductive routings from doped regions in a substrate to conducting pads can be shortened. Interconnection resistance and power loss can be reduced. In addition, the conductive routing structure of the present invention can permit planar current flow so as to reduce resistance and current flow density, thereby increasing the reliability of circuits and devices. The area needed for providing conducting pads on an IC chip can be reduced. As a result, a chip implemented with the present invention can have cheaper dies in a smaller package, lower power loss, and shorter conductive path lengths than a traditional IC structure. The area available for functional devices in a chip, therefore, can be increased. At the same time, the performance of devices and circuits on a chip can be increased as a result of reduced resistance and power loss.

The details of one or more embodiments are set forth in the accompanying drawings and the description below. Other features, objects, and advantages of the invention will be apparent from the description and drawings, and from the claims.

BRIEF DESCRIPTION OF THE DRAWINGS

FIG. 2 is a schematic cross-sectional view of the integrated circuit structure of FIG. 1 illustrating a single source-drain pair.

FIG. 3 is a schematic plan view of a portion of the substrate from FIG. 1.

DETAILED DESCRIPTION

Figure 1:
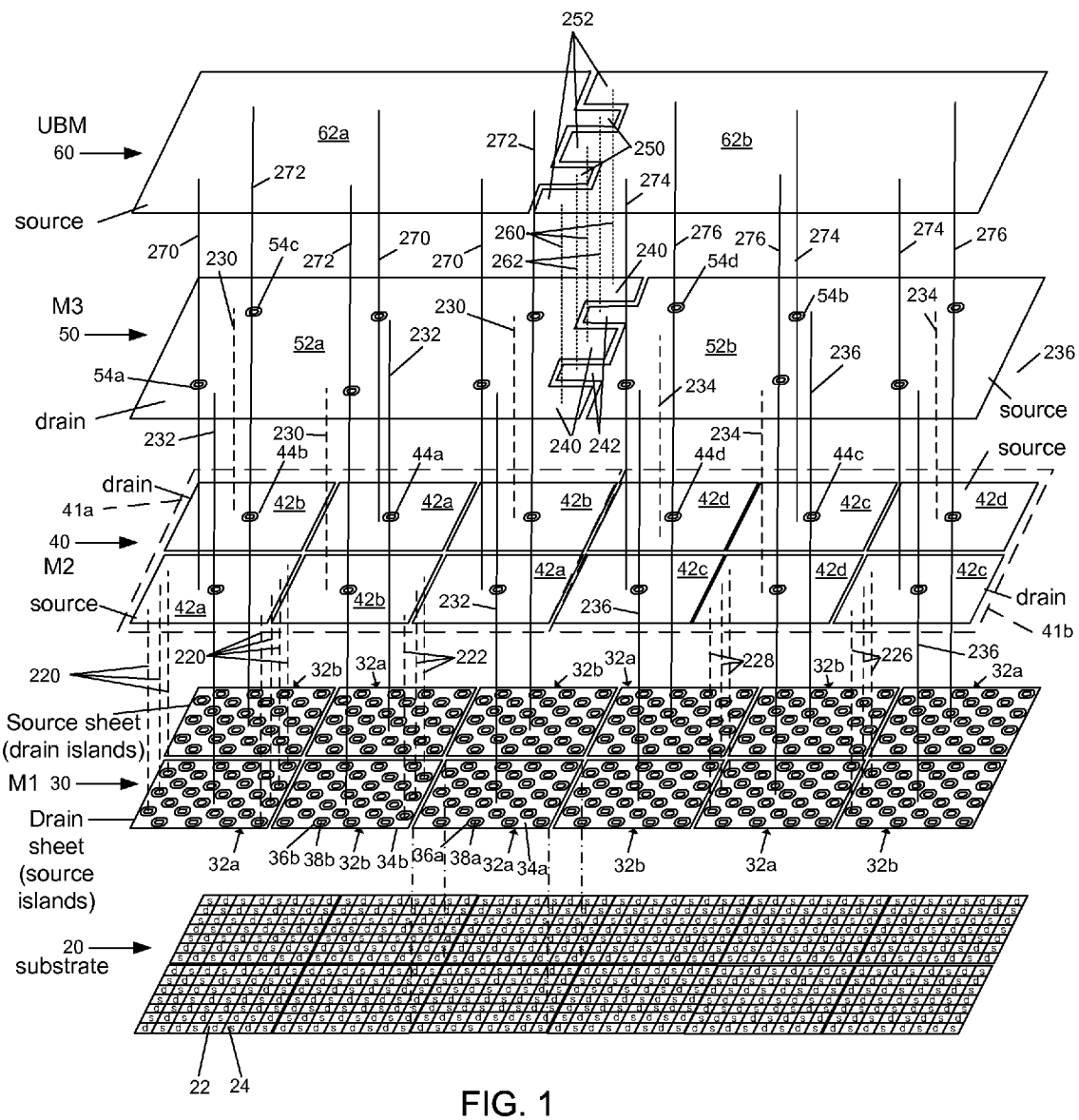
FIG. 1 is a schematic exploded perspective view of an integrated circuit structure with under-bump metallization and a distributed transistor fabricated in a checkerboard pattern.

FIGS. 1 and 2 illustrate one implementation of an integrated circuit structure 10 that can be used as a power switch. The structure 10 includes a substrate 20, a lowermost first conductive layer 30, a middle second conductive layer 40 over the first conductive layer 20, and a third conductive layer 50 over the second conductive layer 40. In addition, an under-bump metallization (UBM) layer 60, also termed a post-passivation metallization, is disposed over the third conductive layer 50 to provide electrical contact for a solder bump 80. The integrated circuit structure has a first insulation layer 70 between the first conductive layer 30 and the second conductive layer 40, a second insulation layer 72 between the second conductive layer 40 and the third conductive layer 50, and a third insulation layer 74, e.g., a passivation layer, between the third conductive layer 50 and the UBM layer 60. The first conductive layer 30 can be formed directly on the substrate 20, although portions of the first conductive layer will be separated from conductive lines formed on the substrate 20 by another insulating layer. The conductive layers can be formed of a metal, such as aluminum or copper, and the insulation layers can be formed of an oxide, such as silicon oxide, or a nitride.

Referring to FIGS. 1-3, the substrate 20 has a number of first doped regions 22 and a number of second doped regions 24 formed in, e.g., implanted into the surface layer of, a semiconductor substrate body 26, e.g., a silicon body. The first doped regions 22 and second doped regions 24 can be doped regions of a distributed transistor. In the illustrated implementation, the first doped regions 22 serve as drain regions ("D") and the second doped regions 24 serve as source regions ("S"). The drain regions 22 and the source regions 24 can be arranged in an alternating checkerboard pattern in the substrate 20 as shown in FIG. 1.

If the switch is to be a PMOS transistor, then the doped regions 22 and 24 can be p-doped portions in an n-type substrate or well. If the switch is to be a NMOS transistor, then the doped regions 22 and 24 can be n-doped portions in a p-type substrate or well. If the switch is to be an LDMOS transistor, then the drain regions 22 can be n-doped portions in an n-type substrate or well, and the source region 24 can include both highly p-doped and highly n-doped portions in a lightly-p-doped p-body in the n-type substrate or well.

A gate 200 is also formed on the substrate 20. Assuming that the doped regions 22 and 24 are arranged in a checkerboard pattern, the gate can include a first set of parallel gate lines 202 and a second set of parallel gate lines 204. The two sets of gate lines 202 and 204 can intersect to form a rectangular array that surrounds each doped region 22 or 24. The gate lines 202 and 204 are formed of a conductive material 210, such as polysilicon, that is separated from the semiconductor substrate body 26 by a gate insulator layer 212, such as silicon dioxide. An additional insulator layer 214 may be formed over the polysilicon to prevent a short circuit with the first conductive layer 30. Apertures 216 in the additional insulator layer 214 provide electrical contact between the first conductive layer 30 and the source and drain regions 22 and 24 in the substrate. Since the gate lines 202 and 204 extend off to the edges of the active area, the vias for electrical connections to the gate lines can be made near the edge of the switch, away from the interconnects for the source and drain.

Returning to FIG. 1, the first conductive layer 30 includes a plurality of first regions 32a and a plurality of second regions 32b. The plurality of first regions 32a are electrically isolated from the plurality of second regions 32b. Each region 32a and 32b overlies multiple source and drain regions 22 and 24. Although each region 32a and 32b is illustrated as overlying an identical sized array of doped regions, this is not required.

Each first region 32a includes an interconnected conductive sheet 34a with apertures 36a. A conductive island 38a is formed in each aperture 36a. Similarly, each second region 32b includes a conductive sheet 34b with apertures 36b and conductive islands 38b formed in the aperture 36b. Thus, the conductive islands are electrically insulated from the conductive sheets. The sheets 34a, 34b can be generally continuous, and the apertures 36a, 36b can be periodically spaced across the sheet.

In each first region 32a, the conductive islands 38a overlie the source regions 24, whereas the conductive sheet 34a overlies and interconnects the drain regions 22. In contrast, in each second region 32b, the conductive islands 38b overlie the drain regions 22 and the conductive sheet 34b overlies and interconnects the source regions 24. Thus, the combination of the conductive sheet 34a and the conductive islands 38b form a drain electrode, whereas the combination of the conductive sheet 34b and the conductive islands 34a form a source electrode.

Figure 9:
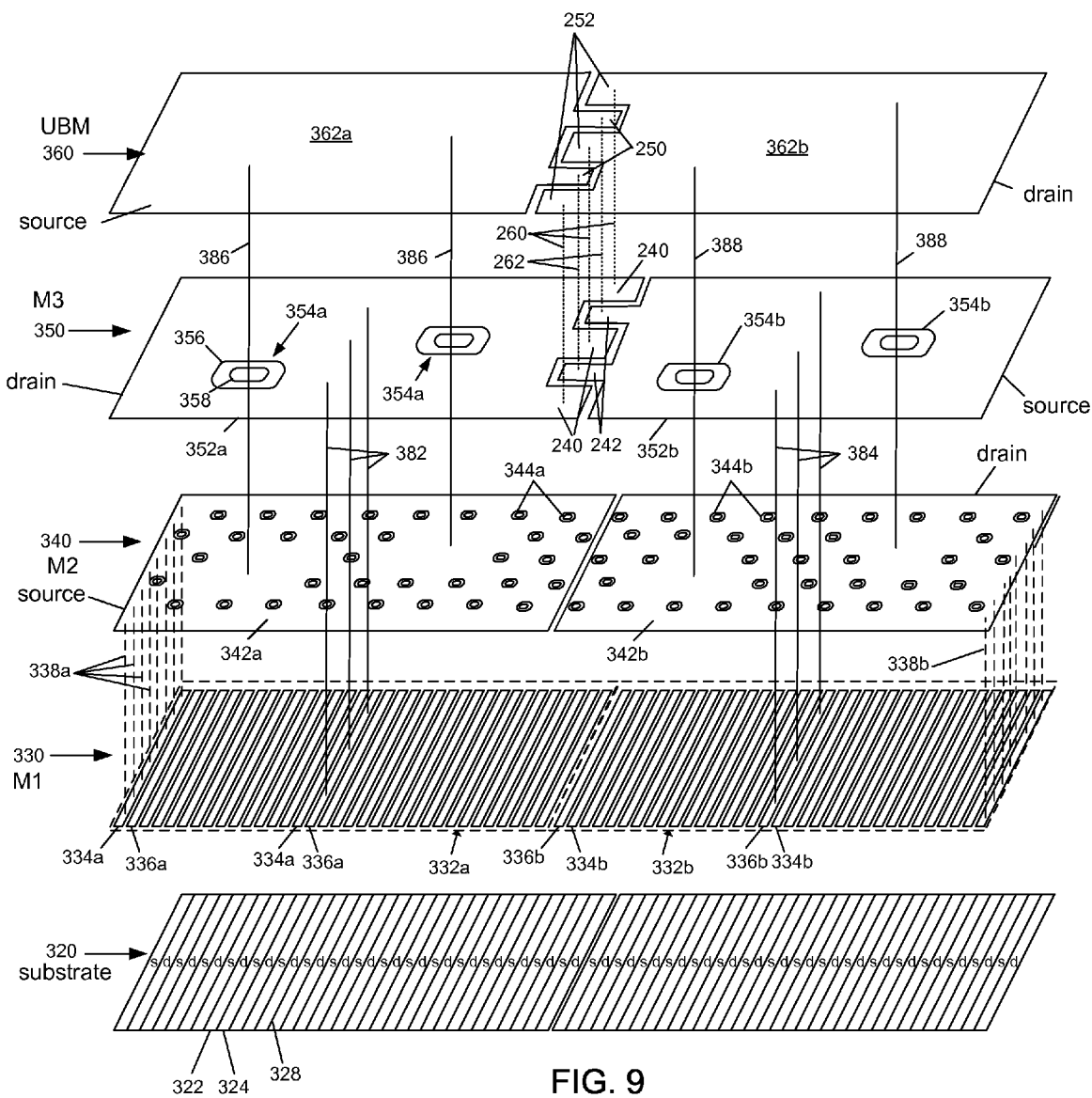
FIG. 9 is a schematic exploded perspective view of an integrated circuit structure with under-bump metallization and a distributed transistor fabricated in a pattern of parallel TOWS.

Many other layouts of the doped regions and the first metal layer 30 are possible. For example, as described below, the doped regions and first conductive layer could be alternating stripes instead of a checkerboard pattern. Optionally, the adjacent portions of the conductive sheets 34a and 34b can form interleaved projections that overlie the drain and source regions 22 and 24, respectively. Optionally, conductive sheets 34a and 34b can be implemented as alternating stripes, e.g., as shown in FIG. 9.

Referring to FIGS. 1-3, the second conductive layer 40 includes a plurality of first conductive areas 42a, a plurality of second conductive areas 42b, a plurality of third conductive areas 44c and a plurality of fourth conductive areas 42d. Each plurality of conductive area 42a, 42b, 42c and 42d is electrically isolated from the other pluralities of conductive area within the second conductive layer 40. Electrical isolation between adjacent conductive areas can be provided by portions of the insulation layer 72. Each conductive area 42a, 42b, 42c and 42d can be about the same size as an underlying conductive region 32a or 32b.

In a first region 41a of the second conductive layer 40, the plurality of first conductive areas 42a and the plurality of second conductive areas 42b are arranged in an alternating pattern, e.g., a checkerboard pattern. Similarly, in a second region 41b of the second conductive layer 40, the plurality of third conductive areas 42c and the plurality of fourth conductive areas 42d are arranged in an alternating pattern, e.g., a checkerboard pattern. For example, each region 41a or 41b can include an array of alternating conductive areas 42a and 42d or 42b and 42c, respectively. Although each region 41a and 41b is illustrated as including an identical sized array of conductive areas, this is not required. In addition, although FIG. 1 illustrates only a single first region 41a and a single second region 41b, there can be multiple regions 41a and 41b themselves arranged in an alternating pattern, e.g., a checkerboard pattern.

The conductive areas 42a, 42b, 42c and 42d of the second conductive layer 40 are connected by vias 220-226 (illustrated in phantom in FIG. 1) to the conductive islands 38a and 38b in the adjacent underlying regions 32a and 32b of the first conductive layer 30. For the purpose of clarity, not every via is illustrated. Specifically, the plurality of first areas 42a of the second conductive layer 40 are electrically coupled to the conductive islands 38a in the underlying first regions 32a of the first conductive layer 30 by vias 220. Similarly, the plurality of second areas 42b of the second conductive layer 40 are electrically coupled to the conductive islands 39b in the underlying second regions 32b of the first conductive layer 30 by vias 222. The plurality of third areas 42c of the second conductive layer 40 are electrically coupled to the conductive islands 38b in the underlying second regions 32b of the second conductive layer 30 by vias 224. The plurality of fourth areas 42d of the second conductive layer 40 are electrically coupled to the conductive islands 38a in the underlying second regions 32b of the first conductive layer 30 by vias 222. Thus, in the second metal layer 40, the combination of the first conductive areas 42a and the fourth conductive areas 42d forms the source electrode, whereas the combination of the second conductive areas 42b and the third conductive areas 42c forms the drain electrode.

Each conductive area 42a, 42b, 42c and 42d can be a planar layer of a conductive material, such as a metal layer. For example, each conductive area 42a, 42b, 42c and 42d can be a substantially continuous plane. However, to provide access from the overlying third conductive layer 50 and under-bump metallization 60 to the conductive sheets 34a and 34b, each conductive area 42a, 42b, 42c and 42d can have one or more isolation structures 44a, 44b, 44c and 44d, respectively.

Figure 4:
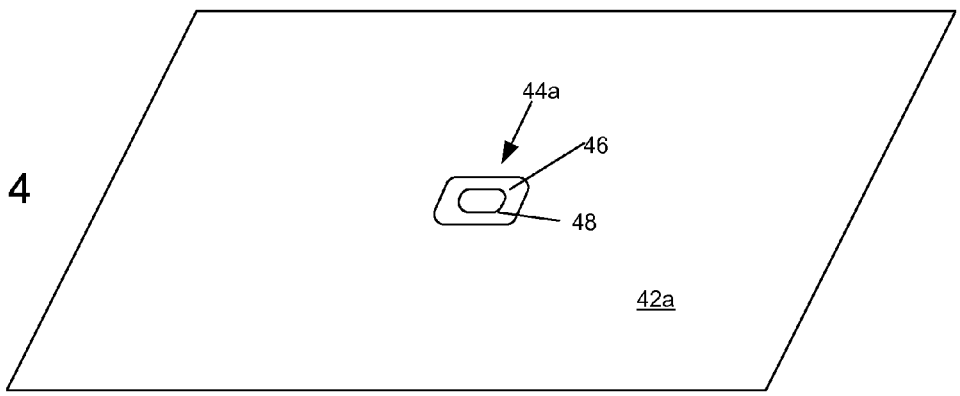
FIG. 4 is a schematic perspective view of a conductive area from the second conductive layer from the integrated circuit structure of FIG. 1.

Referring to FIG. 4, each isolation structure, e.g., isolation structure 44a, is an aperture 46 in the conductive area 42a that includes a conductive island or via 48 that is electrically isolated from the surrounding conductive area 42. These isolation structures will be further discussed below.

Optionally, the first metal layer 30 and the second metal layer 40 can be interconnected at their edges. If so, then adjacent portions of the conductive area 42a, 42b, 42c and 42d can form interleaved projections that overlie the projections from the conductive sheets 34a and 34b. In particular, projections from conductive areas 42a and 42d would overlie and be connected by vias to projections from conductive sheets 34b, whereas projections from conductive areas 42b and 42c would overlie and be connected by vias to projections from conductive sheets 34a. Thus, conductive sheets 34a and conductive areas 42b and 42c would form a laterally interconnected drain, whereas conductive sheets 34b and conductive areas 42a and 42d would form a laterally interconnected source. Alternatively, projections can be formed in only one of the metal layers 30, 40.

Returning to FIG. 1, the third conductive layer 50 includes at least one first region 52a and at least one second region 52b. The first region 52a is electrically isolated from the second region 52b. Each first region 52a of the third conductive layer 50 overlies a first region 41a of the second conductive layer 40, and each second region 52b of the third conductive layer 50 overlies a second region 41b of the second conductive layer 40. Thus, the first region 52a will overlie multiple conductive areas 42a and 42d, and the second region 52b will overlie multiple conductive areas 42b and 42c. For example, each region 52a or 52b can overlie an array of alternating conductive areas 42a and 42d or 42b and 42c, respectively. Although each region 52a and 52b is illustrated overlying an identical sized array of conductive areas, this is not required. In addition, although FIG. 1 illustrates the third conductive layer 50 as including only a single first region 52a and a single second region 52b, there can be multiple regions 52a and 52b arranged in an alternating pattern, e.g., a checkerboard pattern or a sequence of alternating rows.

Each conductive region 52a and 52b can a planar layer of a conductive material, such as a metal layer. For example, each conductive region 52a,d 52b can be a substantially continuous plane. However, to provide access from the overlying under-bump metallization 60 to the conductive areas 42a, 42b, 42c and 42d of the second metal layer 40 and the conductive sheets 34a and 34b of the first metal layer 30, each conductive region 52a, 52b, can have a number of isolation structures 54a, 54b, 54c and 54d. As with the second metal layer, each isolation structure 54a, 54b, 54c or 54d includes an aperture 56 in the conductive area within which is located a conductive island or via 58 that is electrically isolated from the surrounding conductive area. In general, there is at least one isolation structure for each conductive area 42a, 42b, 42c or 42d of the second metal layer 40 that the conductive region 52a or 52b overlies.

The conductive regions 52a and 52b of the third conductive layer 50 are connected by vias 230-236 to the conductive sheets 34a and 34b in the underlying regions 32a and 32b of the first conductive layer 30 and to the conductive areas 42a, 42b, 42c and 42d of the second conductive layer (although FIG. 1 illustrates one via per connected area or region, there could be more than one). Specifically, the first conductive region 52a is electrically coupled to the underlying second conductive areas 42b in the second conductive layer 40 by vias 230. In addition, the first conductive region 52a is electrically coupled to the conductive sheets 34a of the underlying first conductive regions 32a of the first metal layer 30 by vias 232 that pass through the isolation structures 44a in the first conductive areas 42a of the second metal layer 40. Similarly, the second conductive region 52b is electrically coupled to the underlying fourth conductive areas 42d in the second conductive layer 40 by vias 234, and to the conductive sheets 34b of the underlying second conductive regions 32b of the first metal layer 30 by vias 236 that pass through the isolation structures 44c in the third conductive areas 42c of the second metal layer 40. Thus, in the third metal layer 50, the first conductive region(s) 52a is part of the drain electrode, whereas the second conductive region(s) 52b is part of the source electrode.

At the edge of the first conductive region 52a that is adjacent the second conductive region 52b are one or more lateral protrusions 240, such as a plurality of rectangular protrusions. Similarly, at the edge of the second conductive region 52b that is adjacent the first conductive region 52a are one or more lateral protrusions 242, such as a plurality of rectangular protrusions. The rectangular protrusions 240, 242 of the two conductive regions 52a, 52b areas can interlace in an alternating pattern to form a region of interdigitated protrusions at the common edge of the conductive regions 52a and 52b.

As discussed further below, the lateral protrusions 240 of the first conductive region 52a of the third metal layer can vertically underlie protrusions 252 from a second conductive area 62b of the UBM layer 60. Electrical coupling between the lateral protrusions 240 of the first conductive region 52a of the third metal layer 50 and the protrusions 252 from the second conductive area 62b of the UBM layer 60 can be provided by vias 260. Similarly, the lateral protrusions 242 of the second conductive region 52b of the third metal layer can vertically underlie protrusions 250 from a first conductive area 62a of the UBM layer 60. Electrical coupling between the lateral protrusions 242 of the second conductive region 52b of the third metal layer 50 and the protrusions 250 from the first conductive area 62a of the UBM layer 60 can be provided by vias 262.

Figure 5:
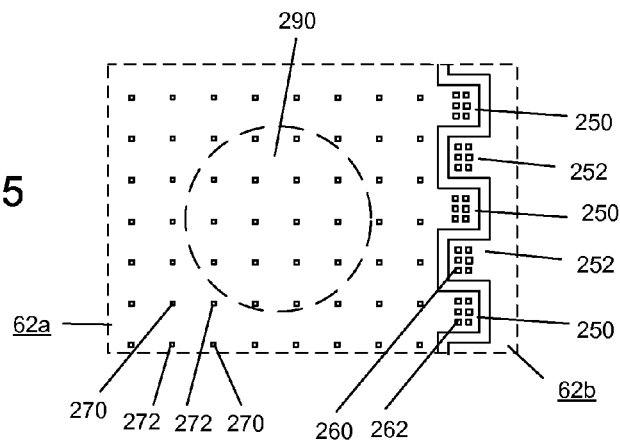
FIG. 5 is schematic plan view of the under-bump metallization layer with the solder bump shown in phantom.
Figure 6:
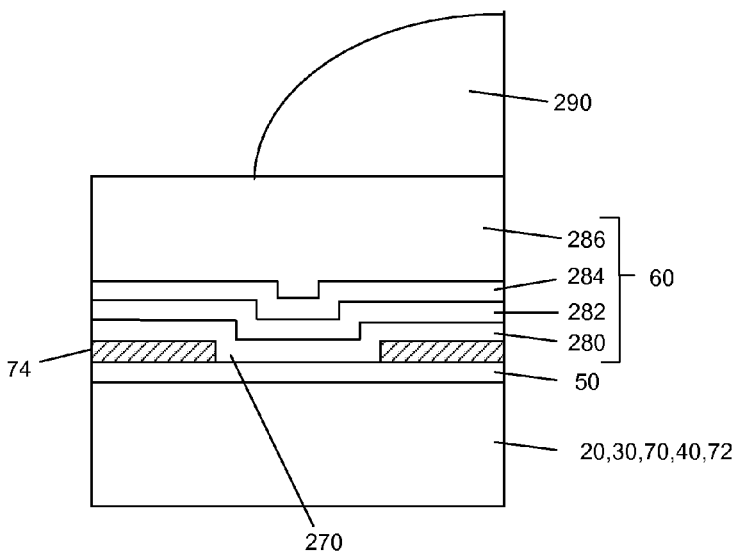
FIG. 6 is a schematic cross-sectional view of the uppermost conductive layer and the under-bump metallization.

Referring to FIGS. 1, 5 and 6, the UBM layer 60 is similar to the third conductive layer 50, and includes one or more first conductive areas 62a and one or more second conductive areas 62b, with the first areas 62a electrically isolated from the second areas 62b. The first conductive area 62a and the second conductive area 62b can simply be physically separated structures on the top surface of the integrated circuit chip (e.g., separated by an air gap), or an insulation layer can be provided in the lateral space between the two areas 62a and 62b.

As best shown in FIG. 6, the UBM layer 60 can include a conductive pad layer 280, such as a metal layer, e.g., aluminum, on which is formed a conductive intermediate layer 282, such as nickel-vanadium alloy. An outer conductive layer, e.g., a copper layer, is then deposited on the intermediate layer. The aluminum layer can be 1 micron thick, and the copper layer can be 0.8 micron or more, e.g., up to 14 microns thick. The intermediate layer 282 provides a diffusion barrier.

In another implementation, the UBM includes a conductive pad layer, such as a metal layer, e.g., titanium. On the titanium layer a thin conductive seed layer, e.g., of copper, is deposited, e.g., by sputtering, and a thick conductive outer layer, e.g., of copper, is deposited, e.g., by plating, on the seed layer. The thick conductive outer layer can be more than 6 microns thick, e.g., more than 9 microns thick, e.g., about 12 to 14 microns thick. The thick copper layer prevents electrical discontinuity from developing due to consumption of the copper layer during formation of the bump.

A metal solder bump 290 is formed on the thick conductive outer layer 286. One metal solder bump 290 can be provided per conductive area 62a or 62b, e.g., particularly if the conductive areas 62a and 62b are arranged in a checkerboard pattern. Alternatively, more than one metal solder bump 290, e.g., a row of bumps, can be provided per conductive area 62a or 62b, e.g., particularly if the conductive areas 62a and 62b are arranged in alternating TOWS.

Vias, e.g., vias 270 or 272, between the UBM layer 60 and the third conductive metal layer 50 (particularly the conductive island 58 in the isolation structures), can be provided by apertures in the passivation layer 74, into which at least the contact layer 282 of the UBM layer 60 extends to contact the third conductive metal layer 50. At least some of the vias 270 or 272 are not directly under the solder bump 290.

As noted above, an edge of the first conductive area 62a adjacent the second conductive area 62b has one or more lateral protrusions 250, e.g., as a plurality of rectangular protrusions that extended toward the second conductive area 62b. Similarly, an edge of the second conductive area 62b adjacent the first conductive area 62a has one or more lateral protrusions 252, e.g., a plurality of rectangular protrusions that extended toward the first conductive area 62a. The rectangular protrusions of the two conductive areas can interlace in an alternating pattern to form a region of inter-digited protrusions at the common edge of the conductive areas 62a and 62b.

The first conductive area 62a of the UBM layer 60 may substantially overlap the first conductive region 52a of the third metal layer 50 except for the extended regions. Similarly, the second conductive region 64b of the UBM layer 60 may substantially overlap the second conductive area 52b of the third metal layer 50 except for the extended regions.

As noted above, the lateral protrusions 250 of the first conductive area 62a of the UBM layer 60 overlap the lateral protrusions 242 of the second conductive region 52a of the third metal layer 50, and vias 262 provide electrical couplings between the overlapped areas. Similarly, the lateral protrusions 252 of the second conductive area 62b of the UBM layer 60 overlap the lateral protrusions 240 of the first conductive region 52a, and vias 260 provide electrical couplings between the overlapped areas. The overlapping protrusions and vias form an "interstitching" structure that electrically couples the first conductive region 52a of the third metal layer 50 with the second conductive area 62b of the UBM layer 60, and electrically couples the second conductive region 52b of the third metal layer 50 with the first conductive region 62a of the UBM layer 60.

The conductive areas 62a and 62b of the UBM 60 are connected by vias 270-276 to the conductive sheets 34a and 34b in the regions 32a and 32b of the first conductive layer 30 and to the conductive areas 42a, 42b, 42c and 42d of the second conductive layer that underlie the particular conductive area (although FIG. 1 illustrates one via per connected area or region, there could be more than one). Specifically, the first conductive area 62a of the UBM layer 60 is electrically coupled to the underlying first conductive areas 42a in the second conductive layer 40 by vias 270 that pass through the isolation structures 54a in the first conductive region 52a of the third metal layer 50. In addition, the first conductive area 62a of the UBM layer 60 is electrically coupled to the conductive sheets 34b of the underlying second conductive regions 32b of the first metal layer 30 by vias 272 that pass through the isolation structures 54b in the first conductive region 52a of the third metal layer 50 and through the isolation structures 44b in the second conductive areas 42b of the second metal layer 40. Similarly, the second conductive area 62b of the UBM layer 60 is electrically coupled to the underlying third conductive areas 42c in the second conductive layer 40 by vias 274 that pass through the isolation structures 54c in the second conductive region 52b of the third metal layer 50, and the second conductive area 62b of the UBM layer 60 is electrically coupled to the conductive sheets 34a of the underlying first conductive regions 32a of the first metal layer 30 by vias 276 that pass through the isolation structures 54d in the second conductive region 52b of the third metal layer 50 and through the isolation structures 44d in the fourth conductive areas 42d of the second metal layer 40. Thus, the first conductive area 62a of the UBM layer 60 becomes the source electrode, and the second conductive area 62b of the UBM layer 60 becomes the drain electrode.

Figure 7:
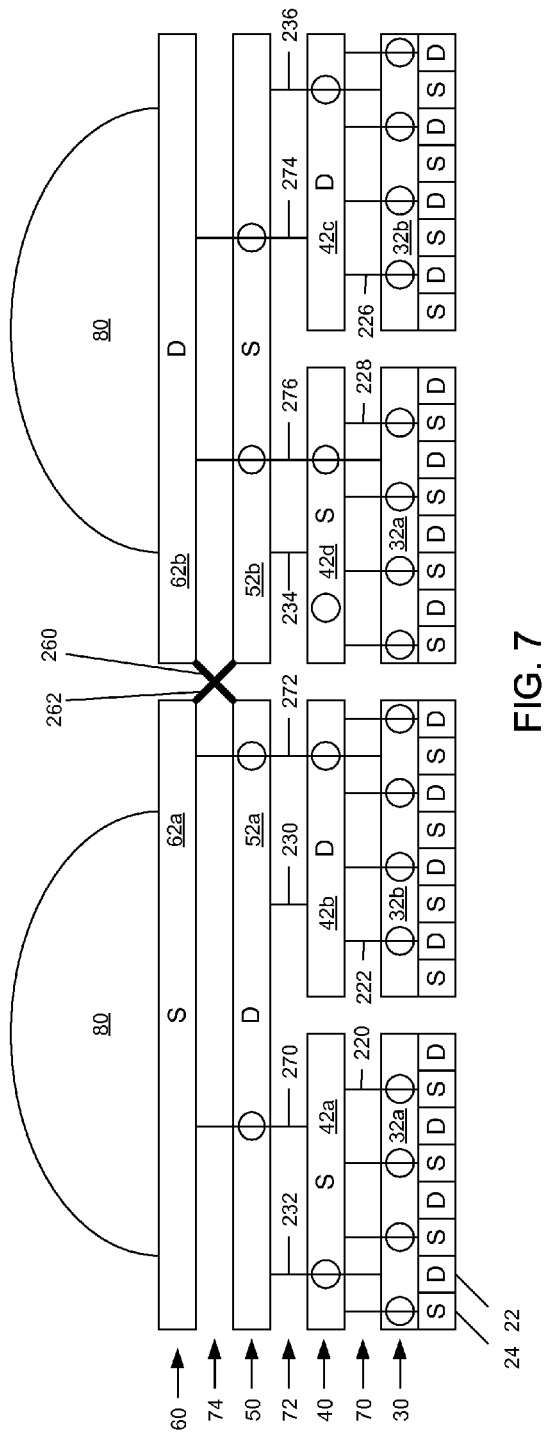
FIG. 7 is a schematic circuit diagram of the integrated circuit structure of FIG. 1.

In summary, FIG. 1 illustrates an implementation in which the drain regions 22 are electrically coupled to the first conductive region 52a of the third metal layer 50 and the second conductive area 62b of the UBM layer 60, the source regions 24 are electrically coupled to the second conductive region 52b of the third metal layer 50 and the first conductive area 62a of the UBM layer 60, and third metal layer 50 and the UBM layer 62 are connected by an interstitching that keeps the drain and source electrodes electrically isolated. A schematic circuit diagram of this configuration is illustrated in FIG. 7.

Figure 8:
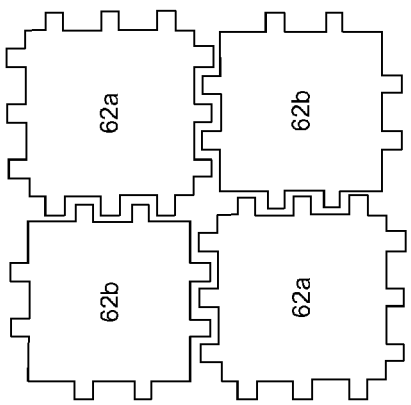
FIG. 8 is a schematic top view illustrating multiple adjacent under bump metallization areas arranged in a checkerboard pattern.

Although FIG. 1 illustrates the UBM layer 60 with just two adjacent conductive areas 62a and 62b, the integrated circuit structure can be fabricated with multiple interconnected areas. For example, referring to FIG. 8, the conductive areas 62a and 62b can be formed in a checkerboard pattern, with interstitching connecting the second and third conductive layers at the adjacent boarder of each pair of conductive areas. Alternatively, the conductive areas 62a and 62b can be arranged in alternating rows, columns, or in some other pattern. This permits the source and drain pads on the top surface of a chip to be arranged in rows, columns, in a checkerboard, or in some other pattern.

With the aforementioned implementation, the integrated circuit structure of the present invention couples the source and drain regions of the distributed transistor to the conductive planes of the UBM layer 60 with short lateral interconnects in the first and second conductive layers. Because the third conductive layer 50 and the UBM layer 60 can be relatively thick, they can carry large amounts of current (in comparison to the buried first and second conductive layers 30 and 40, which should be thinner). In particular, the UBM layer 60 can carry current laterally to vias (e.g., vias that are not directly under the solder bump) with lower resistance than the first and second conductive layers. The planar current flow in the third conductive layer 50 and UBM layer 60 and the short path of direct vertical interconnects reduce the current flow density and resistance of interconnects. The invention therefore reduces power loss of circuits and improves the reliability of circuits and devices. If conducting pads can be placed above the functional area, the invention reduces area needed for providing conducting pads on an IC chip and produces cheaper dies in a smaller package than a traditional IC structure.

Figure 10:
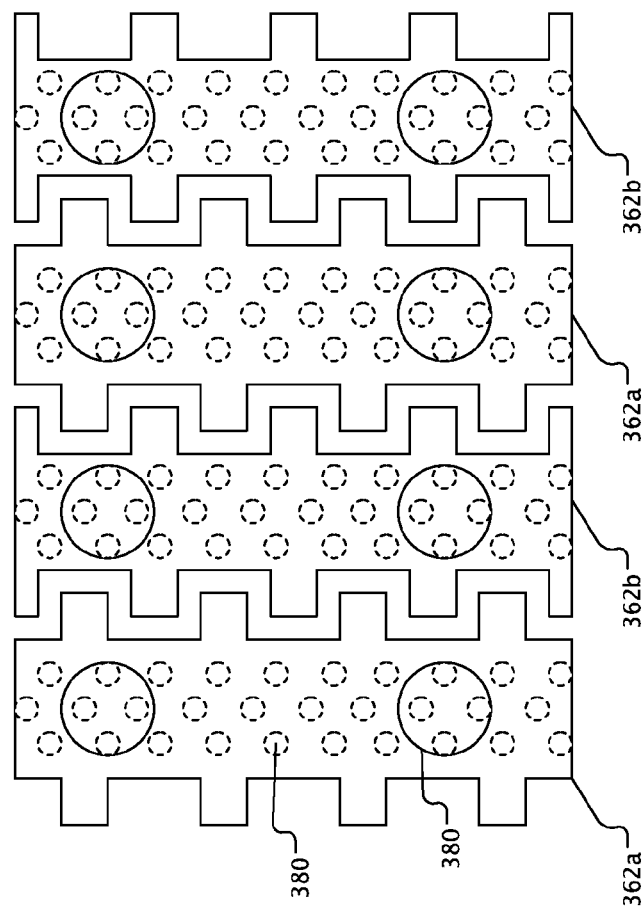
FIG. 10 is a schematic top view illustrating multiple adjacent under bump metallization areas arranged in parallel rows.

FIGS. 9 and 10 illustrate another implementation of an integrated circuit structure 310 that can be used as a power switch. Except as set forth below, the integrated circuit structure of FIGS. 9 and 10 can be constructed similarly to the structure of FIGS. 1-8.

The structure 310 includes a substrate 320, a lowermost first conductive layer 310, a middle second conductive layer 340 over the first conductive layer 320, and a third conductive layer 350 over the second conductive layer 340. In addition, an under-bump metallization (UBM) layer 360 is disposed over the third conductive layer 350 to provide electrical contact for a solder bump 380.

Referring to FIG. 9, the substrate 320 has a number of first doped regions 322 and a number of second doped regions 324 formed in, e.g., implanted into the surface layer of, a semiconductor substrate body, e.g., a silicon body. The first doped regions 322 and second doped regions 324 can be doped regions of a distributed transistor. In the illustrated implementation, the first doped regions 322 serve as drain regions ("D") and the second doped regions 324 serve as source regions ("S"). The drain regions 322 and the source regions 324 can be arranged in alternating rows as shown in FIG. 9. The gate can include parallel gate lines 328 that run between each pair of adjacent doped region 322 and 324. Since the gate lines 328 extend off to the opposing edges of the active area, the vias for electrical connections to the gate lines can be made near the edge of the switch, away from the interconnects for the source and drain.

The first conductive layer 330 includes a plurality of first regions 332a and a plurality of second regions 332b. In each first region 332a, conductive strips 334a overlie the source regions 324 and conductive strips 336a overlie the drain regions 322. In contrast, in each second region 332b, conductive strips 334b overlie the drain regions 322 and conductive strips 336b overlie the source regions 324. Thus, the combination of the conductive strips 334a and the conductive strips 336b form a source electrode, whereas the combination of the conductive strips 334b and the conductive strips 336a form a drain electrode. Each region 332a and 332b overlies multiple source and drain regions 322 and 324, e.g., multiple rows of alternating regions. Adjacent conductive strips are electrically insulated from each other. Although each region 332*a* and 332*b* is illustrated as overlying an identical sized group of doped regions, this is not required. Optionally, one or both sets of conductive strips within a region can be electrically connected within the first conductive layer. For example, the strips 334*a* could extend past the ends of strips 336*a* and be connected to a conductive bar extending along one edge of the region 332*a* perpendicular to the strips.

The second conductive layer 340 includes a plurality of first conductive areas 342*a* and a plurality of second conductive areas 342*b* (only one of each conductive area is illustrated). Each plurality of conductive area 342*a*, 342*b* is electrically isolated from the other plurality of conductive areas within the second conductive layer 340. Each conductive area 342*a*, 342*b* can be about the same size as an underlying conductive region 332*a* or 332*b*, and the conductive areas 342*a*, 342*b* can be arranged in alternating rows.

The conductive areas 342*a* of the second conductive layer 40 are connected by vias 338*a* to the conductive strips 334*a* in the adjacent underlying regions 332*a* of the first conductive layer 330. Similarly, the conductive areas 342*b* of the second conductive layer 40 are connected by vias 338*b* to the conductive strips 334*b* in the adjacent underlying regions 332*b* of the first conductive layer 330. For the purpose of clarity, not every via is illustrated.

Thus, in the second metal layer 340, the combination of the first conductive areas 342*a* forms the source electrode, whereas the combination of the second conductive areas 342*b* forms the drain electrode.

Each conductive area 342*a* and 342*b* can be a planar layer of a conductive material, such as a metal layer. For example, each conductive area 342*a*, 342*b* can be a substantially continuous plane. However, to provide access from the overlying third conductive layer 350 to the conductive strips that are not connected to the second conductive layer 340, each conductive area 342*a* and 342*b* can have one or more isolation structures 344*a* and 344*b*, respectively. Each isolation structure includes an aperture in the conductive area and a conductive island or via in the aperture that is electrically isolated from the surrounding conductive area.

The third conductive layer 350 includes at least one first region 352*a* and at least one second region 352*b*. The first region 352*a* is electrically isolated from the second region 352*b*. Each first region 352*a* of the third conductive layer 350 overlies a first conductive area 342*a* of the second conductive layer 340, and each second region 352*b* of the third conductive layer 350 overlies a second conductive area 342*b* of the second conductive layer 340.

Each conductive region 352*a* and 352*b* can a planar layer of a conductive material, such as a metal layer. For example, each conductive region 352*a*, 352*b* can be a substantially continuous plane. However, to provide access from the overlying under-bump metallization 360 to the conductive areas 342*a*, 342*b* of the second metal layer 340, each conductive region 352*a*, 352*b*, can have a number of isolation structures 354*a*, 354*b*, respectively. As with the second metal layer, each isolation structure 354*a*, 354*b* includes an aperture 356 in the conductive area within which is located a conductive island or via 358 that is electrically isolated from the surrounding conductive area. However, the isolation structures 354*a*, 354*b* can be significantly larger than the isolation structures 344*a*, 344*b* so as to accommodate larger current flow per structure. There can be multiple isolation structures in each conductive region 352*a*, 352*b*.

The conductive regions 352*a* and 352*b* of the third conductive layer 50 are connected by vias 382, 384 to the conductive strips 336*a* and 336*b* in the underlying regions 332*a* and 332*b* of the first conductive layer 330. Specifically, the first conductive region 352*a* is electrically coupled to the conductive strips 336*a* of the underlying first conductive regions 332*a* of the first metal layer 30 by vias 382 that pass through the isolation structures 344*a* in the first conductive areas 342*a* of the second metal layer 40. Similarly, the second conductive region 352*b* is electrically coupled to the conductive strips 336*b* of the underlying first conductive regions 332*b* of the first metal layer 30 by vias 384 that pass through the isolation structures 344*b* in the second conductive areas 342*b* of the second metal layer 340.

Not all vias are illustrated for clarity. Thus, in the third metal layer 350, the first conductive region(s) 352*a* is part of the drain electrode, whereas the second conductive region(s) 352*b* is part of the source electrode.

The density of vias 338*a*, 338*b* per unit length of the conductive strips 334*a*, 334*b* can be greater than the density of vias 382, 384 per unit length of the conductive strips 336*a*, 336*b*.

At the edge of the first conductive region 352*a* that is adjacent the second conductive region 352*b* are one or more lateral protrusions 240, such as a plurality of rectangular protrusions. Similarly, at the edge of the second conductive area 342*a* that is adjacent the first conductive region 352*a* are one or more lateral protrusions 242, such as a plurality of rectangular protrusions. The rectangular protrusions 240, 242 of the two conductive regions 352*a*, 352*b* areas can interlace in an alternating pattern to form a region of interdigitated protrusions at the common edge of the conductive regions 352*a* and 352*b*.

The UBM layer 360 includes one or more first conductive areas 362*a* and one or more second conductive areas 362*b*, with the first areas 362*a* electrically isolated from the second areas 362*b*. An edge of the first conductive area 362*a* adjacent the second conductive area 362*b* has one or more lateral protrusions 250, e.g., as a plurality of rectangular protrusions that extended toward the second conductive area 362*b*. Similarly, an edge of the second conductive area 362*b* adjacent the first conductive area 362*a* has one or more lateral protrusions 252, e.g., a plurality of rectangular protrusions that extended toward the first conductive area 362*a*. The rectangular protrusions of the two conductive areas can interlace in an alternating pattern to form a region of interdigitated protrusions at the common edge of the conductive areas 362*a* and 362*b*.

The first conductive area 362*a* of the UBM layer 360 can substantially overlap the first conductive region 352*a* of the third metal layer 350 except for the extended regions. Similarly, the second conductive region 362*b* of the UBM layer 360 can substantially overlap the second conductive area 352*b* of the third metal layer 350 except for the extended regions. The lateral protrusions 250 of the first conductive area 362*a* of the UBM layer 360 overlap the lateral protrusions 242 of the second conductive region 352*a* of the third metal layer 350, and vias 262 provide electrical couplings between the overlapped areas. Similarly, the lateral protrusions 252 of the second conductive area 362*b* of the UBM layer 360 overlap the lateral protrusions 240 of the first conductive region 352*a*, and vias 260 provide electrical couplings between the overlapped areas. The overlapping protrusions and vias form an "interstitching" structure that electrically couples the first conductive region 352*a* of the third metal layer 350 with the second conductive area 362*b* of the UBM layer 360, and electrically couples the second conductive region 352b of the third metal layer 350 with the first conductive region 362a of the UBM layer 360.

The conductive areas 362a and 362b of the UBM 360 are connected by vias 386, 388 to the conductive areas 342a and 342b of the second conductive layer 340 that underlie the particular conductive area (although FIG. 1 illustrates two vias per connected area or region, there could be just one or more than two). Specifically, the first conductive area 362a of the UBM layer 360 is electrically coupled to the underlying first conductive areas 342a in the second conductive layer 340 by vias 386 that pass through the isolation structures 354a in the first conductive region 352a of the third metal layer 350. Similarly, the second conductive area 362b of the UBM layer 360 is electrically coupled to the underlying second conductive areas 342b in the second conductive layer 340 by vias 388 that pass through the isolation structures 354b in the second conductive region 352b of the third metal layer 350. Thus, the first conductive area 362a of the UBM layer 360 becomes the source electrode, and the second conductive area 362b of the UBM layer 360 becomes the drain electrode.

The density of vias 382, 384 can be greater than the density of vias 386, 388. The vias 344a, 344b from the third metal layer 350 to the first metal layer 330 can be omitted in regions where the large vias 348 connects the UBM layer 360 and the second metal layer 340.

Optionally, the edges of the second metal layer 340 can be interstitched with the edges of the third metal layer 350. For example, portions of the projections 240 of the first conductive region 352a in the third metal layer 350 can extend over and be connected by vias to the second conductive area 342b in the second metal layer 340, and portions of the projections 242 of the second conductive region 352b in the third metal layer 350 can extend over and be connected by vias to the first conductive area 342a in the second metal layer 340. Thus, as illustrated in FIG. 9, the projections are formed in only one of the metal layers 340, 350.

The present invention may be implemented to various kinds of IC chips for providing external couplings to the IC chips. Without limiting the scope of the present invention, the implementation of the invention to an IC chip for voltage regulators is illustrated in detail below as an example.

Voltage regulators, such as DC-to-DC converters, are used to provide stable voltage sources for electronic systems. Switching voltage regulators (or simply "switching regulators") are known to be an efficient type of DC-to-DC converter. A switching regulator generates an output voltage by converting an input DC voltage into a high frequency voltage waveform, and filtering the high frequency voltage waveform to generate the output DC voltage. Specifically, the switching regulator includes a switch for alternately coupling and decoupling an input DC voltage source, such as a battery, to a load, such as an IC chip. An output filter, typically including an inductor and a capacitor that are provided between the input voltage source and the load, filters the output of the switch and thus provides the output DC voltage. A pulse modulator, such as a pulse width modulator or a pulse frequency modulator, typically controls the switch.

Figure 11:
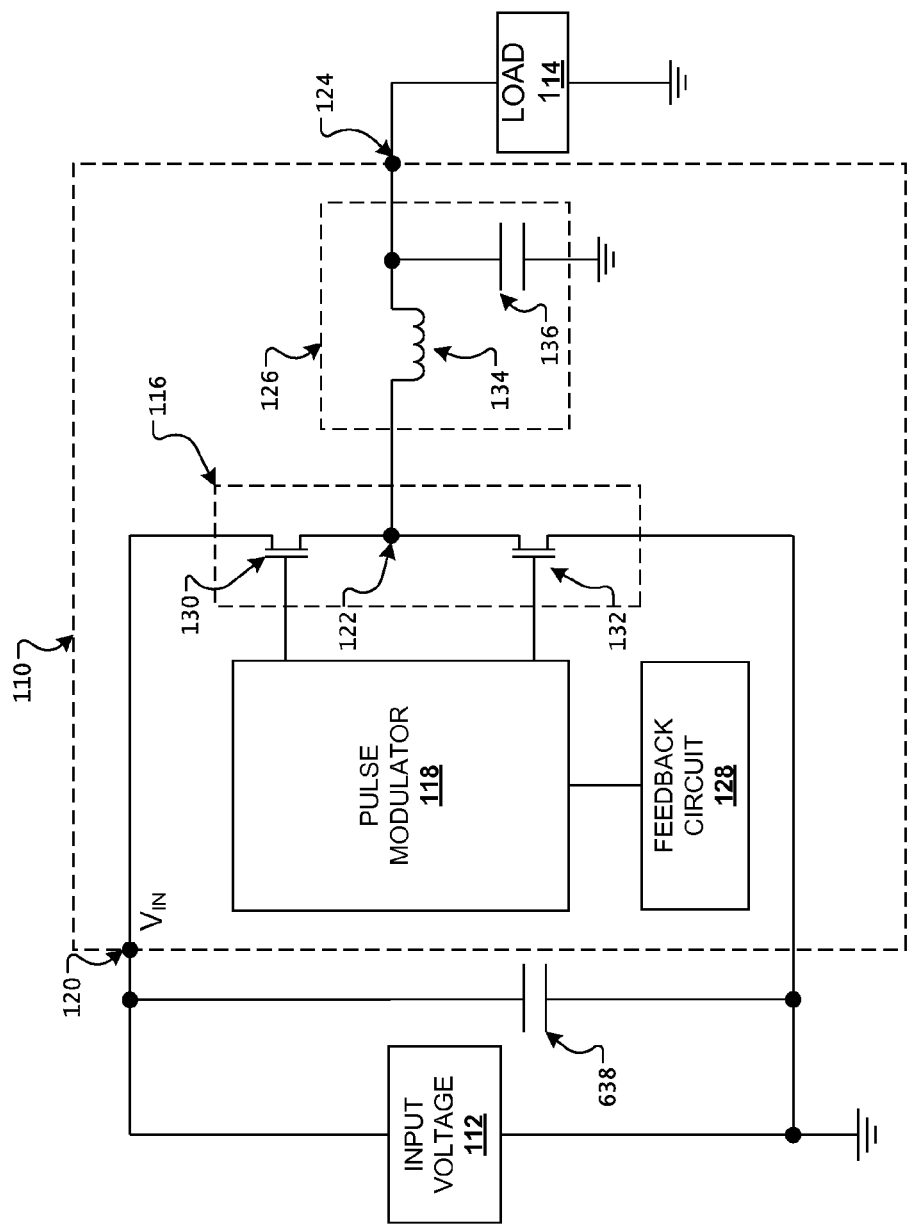
FIG. 11 is a block diagram of a switching regulator.

Referring to FIG. 11, an implementation of a switching regulator 110 is coupled to a DC input voltage source 112, such as a battery, by an input terminal 120. The switching regulator 110 is also coupled to a load 114, such as an IC chip, by an output terminal 124. The switching regulator 110 serves as a DC-to-DC converter between the input terminal 120 and the output terminal 124. The switching regulator 110 includes a switching circuit 116 that serves as a power switch for alternately coupling and decoupling the input terminal 120 to an intermediate terminal 122. The switching circuit 116 includes a rectifier, such as a switch or diode, coupling the intermediate terminal 122 to ground. Specifically, the switching circuit 116 and the output filter 126 may be configured in a buck converter topology with a first transistor 130 connected between the input terminal 120 and the intermediate terminal 122 and a second transistor 132 connected between ground and the intermediate terminal 122. The first transistor 130 may be a P-type MOS (PMOS) device or N-type LDMOS device, whereas the second transistor 132 may be an N-type MOS (NMOS) device or N-type LDMOS device, and other permutations of PMOS, NMOS, P-type LDMOS and N-type LDMOS devices are possible. The switching regulator 110 may also include an input capacitor 138 connecting the input terminal 122 to ground.

The switching regulator also includes a controller assembly with a pulse modulator 118 for controlling the operation of the switching circuit 116. The pulse modulator 118 causes the switching circuit 116 to generate an intermediate voltage having a rectangular waveform at the intermediate terminal 122. Although the pulse modulator 118 and the switching circuit 116 are illustrated and described below as a pulse width modulator, the invention is also applicable to various pulse frequency modulation schemes.

The intermediate terminal 122 is coupled to the output terminal 124 by an output filter 126. The output filter 126 filters the rectangular waveform of the intermediate voltage at the intermediate terminal 122 into a substantially DC output voltage at the output terminal 124. Specifically, in a buck-converter topology, the output filter 126 includes an inductor 134 connected between the intermediate terminal 122 and the output terminal 124 and a capacitor 136 connected in parallel with the load 114. During a first conduction interval, the voltage source 112 supplies energy to the load 114 and the inductor 134 via the first transistor 130. During a second conduction interval, transistor 132 is closed and the inductor 134 supplies the energy. The resulting output voltage $V_{out}$ is a substantially DC voltage. Although the switching circuit 116 and the output filter 126 are illustrated in a buck converter topology, the invention is also applicable to other switching voltage regulator topologies, such as a boost converter topology, a buck-boost converter topology, or a variety of transformer coupled topologies.

The output voltage is regulated, or maintained at a substantially constant level, by a feedback loop in the controller assembly that includes a feedback circuit 128. The feedback circuit 128 includes circuitry that measures the output voltage and/or the current passing through the intermediate terminal. The measured voltage and current are used to control the pulse modulator 118 so that the output voltage at the output terminal 124 remains substantially constant.

The conductive routings of the present invention can be used in the switching circuit 116 to provide a flip-chip package that includes the switching circuit and provides external couplings. In general, each switch in the switching circuit 116 is fabricated as a distributed array of parallel transistors, and the conductive routing structures discussed above can carry current from the doped regions to the conducting pads on the surface of the chip.

For example, if the second transistor 132 is implemented as an n-channel device, it can include rectangular n-doped source regions 24 and drain regions 22 laid out in a checkerboard pattern in a p-type well or substrate. If the first transistor 130 is implemented as a p-channel device, is can include alternating rectangular p-doped source regions and drain regions in an n-type well or substrate. If the first transistor 130 is implemented as an re-channel device, it can include alternating rectangular n-doped source regions and drain regions in a p-type well or substrate. A grid-like gate may be implemented to separate each pair of source and drain regions. Electrical connection to the gate can be provided at the peripheral edge of the chip.

Figure 12:
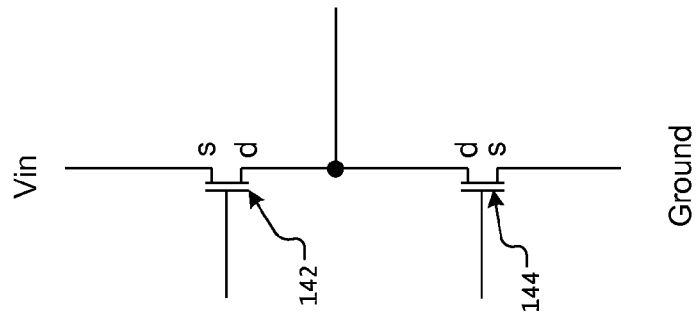
FIG. 12 is a circuit diagram illustrating electrical connections of an under-bump metallization layer.

Although the description above has focused on the use of the electrical routing to opposite sides of a transistor switch (so that one region of the UBM is connected to a source region of a distributed transistor and another region of the UBM is connected to a drain region of a distributed transistor), the routing structure is generally applicable to supply power to any integrated device, particular integrated devices with regular arrays of circuitry needing connection to an input voltage and ground. Thus, one region of the UBM can be electrically connected to an input voltage line of a circuit block and the other region of the UBM can be electrically connected to the ground line of the circuit block. For example, as shown in FIG. 12, the first region of the UBM is connected as $V_{in}$ to a source of a high-side transistor 142 and another region of the UBM is connected as ground to a source of a low-side transistor 144.

Although the various isolation structures are discussed and illustrated as including one conductive island or via, the isolation structures can include multiple vias in parallel. Although the drawings illustrate hemispherical solder bumps 80, 390, other flip-chip interconnects can be used, such as stud bumps or copper pillars, and the solder bumps can solder balls or be formed in other shapes such as, for example, studs or columnar members.

A number of embodiments of the invention have been described. Nevertheless, it will be understood that various modifications may be made without departing from the spirit and scope of the invention. Numerous modifications to the configuration of the conductive routings structure will occur to those of ordinary skill in the art. Accordingly, other embodiments are within the scope of the following claims.

What is claimed is:

1. An integrated circuit structure comprising:
   a first conductive layer disposed on a substrate and providing first electrodes and second electrodes for a distributed transistor in the substrate, wherein the first electrodes and the second electrodes are disposed on the substrate in a pattern of alternating rows;
   a second conductive layer over the first conductive layer, the second conductive layer having a first conductive portion and a second conductive portion electrically isolated from the first conductive portion, wherein the first conductive portion overlies a first plurality of the first electrodes and a first plurality of the second electrodes and the second conductive portion overlies a second plurality of the first electrodes and a second plurality of the second electrodes;
   a third conductive layer over the second conductive layer, the third conductive layer having a first conductive region and a second conductive region electrically isolated from the first conductive region, the first conductive region substantially located over the first conductive portion and the second conductive region substantially located over the second conductive portion;
   first conductive vias connecting the first conductive region to the first plurality of the first electrodes through apertures in the first conductive portion and connecting the second conductive region to the second plurality of the second electrodes through apertures in the second conductive portion, the first conductive vias disposed with a first density per unit length along the rows;
   second conductive vias connecting the first conductive portion to the second plurality of the first electrodes and connecting the second conductive portion to the first plurality of second electrodes, the second conductive vias disposed with a second density per unit length along the rows that is greater than the first density; and
   a fourth conductive layer over the third conductive layer, the fourth conductive layer having a first conductive area and a second conductive area electrically isolated from the first conductive area, the first conductive area substantially located over the first conductive region and the second conductive area substantially located over the second conductive region.

2. The integrated circuit structure of claim 1, wherein the first conductive region includes a first protrusion extending toward the second conductive region and over the second conductive portion, and the second conductive region includes a second protrusion extending toward the first conductive region and over the first conductive portion.

3. The integrated circuit structure of claim 2, wherein the first conductive region and the second conductive region comprise interdigited protrusions, the interdigited protrusions including the first protrusion and the second protrusion.

4. The integrated circuit structure of claim 2, wherein the first conductive portion and the second conductive portion lack interdigited protrusions.

5. The integrated circuit structure of claim 1, wherein the fourth conductive layer comprises an under-bump metallization layer.

6. The integrated circuit structure of claim 1, comprising third conductive vias connecting the first conductive area to the first conductive portion through apertures in the first conductive region and connecting the second conductive area to the second conductive portion through apertures in the second conductive region.

7. The integrated circuit structure of claim 6, comprising fourth conductive vias connecting the first conductive area to the second conductive region and connecting the second conductive area to the first conductive region.

8. The integrated circuit structure of claim 7, wherein the first conductive area or the first conductive region includes a protrusion extending toward the second conductive area or second conductive region, respectively, and the fourth conductive vias are in the protrusion.

9. The integrated circuit structure of claim 7, comprising an outermost passivation layer, and wherein the first conductive vias and the second conductive vias extend through the outermost passivation layer.

10. An integrated circuit structure comprising:
   a first conductive layer disposed on a substrate and providing first electrodes and second electrodes for a distributed transistor in the substrate;
   a second conductive layer over the first conductive layer, the second conductive layer having first conductive portions and second conductive portions electrically isolated from the first conductive portions, the first conductive portions and the second conductive portions arranged in an alternating pattern;
   a third conductive layer over the second conductive layer, the third conductive layer having a first conductive region and a second conductive region electrically isolated from the first conductive region, the first conductive region located over a first plurality of the first conductive portions and a first plurality of the second conductive portions, and the second conductive region located over a second plurality of the first conductive portions and a second plurality of the second conductive portions;

first conductive vias connecting the first conductive region to the first electrodes through apertures in the first plurality of first conductive portions and connecting the second conductive region to the second electrodes through apertures in the second plurality of second conductive portions;

second conductive vias connecting the second plurality of first conductive portions to the first electrodes and connecting the first plurality of second conductive portions to the second electrodes; and a fourth conductive layer over the third conductive layer, the fourth conductive layer having a first conductive area and a second conductive area electrically isolated from the first conductive area, the first conductive area substantially located over the first conductive region and the second conductive area substantially located over the second conductive region.

11. The integrated circuit structure of claim 10, wherein the first conductive region includes a first protrusion extending toward the second conductive region and over the second conductive portion, and the second conductive region includes a second protrusion extending toward the first conductive region and over the first conductive portion.

12. The integrated circuit structure of claim 11, wherein the first conductive region and the second conductive region comprise interdigited protrusions, the interdigited protrusions including the first protrusion and the second protrusion.

13. The integrated circuit structure of claim 11, wherein the first conductive portion and the second conductive portion lack interdigited protrusions.

14. The integrated circuit structure of claim 10, wherein each first conductive portion overlies a plurality of the second electrodes, and each second conductive portion overlies a plurality of the first electrodes.

15. The integrated circuit structure of claim 14, wherein each first conductive portion overlies exactly one of the first electrodes and each second conductive portion overlies exactly one of the second electrodes.

16. The integrated circuit structure of claim 10, wherein the first conductive portions and the second conductive portions are arranged in a checkerboard pattern.

* * * * *